United States Patent
Siddiqi et al.

(10) Patent No.: US 10,109,081 B2
(45) Date of Patent: Oct. 23, 2018

(54) RECOVERY OF MISSING INFORMATION IN DIFFUSION MAGNETIC RESONANCE IMAGING DATA

(71) Applicant: THE ROYAL INSTITUTION FOR THE ADVANCEMENT OF LEARNING/MCGILL UNIVERSITY, Montreal (CA)

(72) Inventors: Kaleem Siddiqi, Westmount (CA); Emmanuel Piuze-Phaneuf, Montreal (CA); Jon Sporring, Allerod (DK)

(73) Assignee: THE ROYAL INSTITUTION FOR THE ADVANCEMENT OF LEARNENG / MGGILL UNIVERSITY, Montreal (CA)

( * ) Notice: Subject to any disclaimer, the term of this patent is extended or adjusted under 35 U.S.C. 154(b) by 0 days.

(21) Appl. No.: 15/154,404

(22) Filed: May 13, 2016

(65) Prior Publication Data
US 2016/0335786 A1 Nov. 17, 2016

Related U.S. Application Data

(60) Provisional application No. 62/160,694, filed on May 13, 2015.

(51) Int. Cl.
| G06K 9/00 | (2006.01) |
| G06T 11/00 | (2006.01) |
| G01R 33/56 | (2006.01) |
| G06T 5/00 | (2006.01) |
| G01R 33/563 | (2006.01) |

(52) U.S. Cl.
CPC ........ *G06T 11/008* (2013.01); *G01R 33/5608* (2013.01); *G06T 5/005* (2013.01); *G01R 33/56341* (2013.01); *G06T 2207/10092* (2013.01)

(58) Field of Classification Search
USPC .................................................. 382/128–134
See application file for complete search history.

(56) References Cited

U.S. PATENT DOCUMENTS

| 2007/0274579 A1* | 11/2007 | Cai .................... A61B 5/02007 382/131 |
| 2010/0278405 A1* | 11/2010 | Kakadiaris .......... G06F 19/3431 382/131 |

OTHER PUBLICATIONS

Streeter, D.D.: Gross morphology and fiber geometry of the heart. In: Berne, R.M., Sperelakis, N. (eds.) Handbook of Physiology, Section 2. The Heart, pp. 61-112. Williams and Wilkins, New York (1979).

(Continued)

*Primary Examiner* — Alex Liew
(74) *Attorney, Agent, or Firm* — Norton Rose Fulbright Canada LLP

(57) ABSTRACT

There is described herein a method for recovering missing information in diffusion magnetic resonance imaging (dMRI) data. The data are modeled according to the theory of moving frames and regions where frame information is missing are reconstructed by performing diffusions into the regions. Local orthogonal frames computed along the boundary of the regions are rotated into the regions. Connection parameters are estimated at each new data point obtained by a preceding rotation, for application to a subsequent rotation.

20 Claims, 13 Drawing Sheets

(56) References Cited

OTHER PUBLICATIONS

Peskin, C.S.: Mathematical aspects of heart physiology. Technical report, Courant Institute of Math. Sciences, New York University, New York, NY, USA (1975).
Horowitz, A., Perl, M., Sideman, S.: Geodesics as a mechanically optimal fiber geometry for the left ventricle. Basic. Res. Cardiol. 88(suppl. 2), 67-74 (1993).
Geerts, L., Bovendeerd, P., Nicolay, K., Arts, T.: Characterization of the normal cardiac myofiber field in goat measured with mr-diffusion tensor imaging. Am. J. Physiol.: Heart and Circ. Physiol. 283, H139-H145 (2002).
Beg, M.F., Helm, P.A., McVeigh, E.M., Miller, M.I.,Winslow, R.L.: Computational cardiac anatomy using mri. Magn. Reson. Med. 52,1167-1174 (2004).
Chen, J., Liu, W., Zhang, H., Lacy, L., Yang, X., Song, S.K., Wickline, W.A., Yu, X.: Regional ventricular wall thickening reflects changes in cardiac fiber and sheet structure during contraction: quantification with diffusion tensor mri, Am. J. Physiol.: Heart and Circ. Physiol. 289, H1898-H1907 (2005).
Streeter, D., Bassett, D.: An engineering analysis of myocardial fiber orientation in pig's left ventricle in systole. The Anatomical Record 155(4), 503-511 (2005).
LeGrice, I.J., Smaill, B.H., Chai, L.Z., Edgar, S.G., Gavin, J.B., Hunter, P.J.: Ventricular myocyte arrangement and connective tissue architecture in the dog. Am, J. Physiol.: Heart and Circ. Physiol. 269 (1995).
Rohmer, D., Sitek, A., Gullberg, G.T.: Reconstruction and visualization of fiber and laminar structure in the normal human heart from ex vivo diffusion tensor magnetic resonance imaging (dtmri) data. Invest. Radiol. 42(11), 777-789 (2007).
Lombaert, H., Peyrat, J.-M., Croisille, P., Rapacchi, S., Fanton, L., Clarysse, P., Delingette, H., Ayache, N.: Statistical analysis of the human cardiac fiber architecture from DT-MRI, In: Metaxas, D.N., Axel, L. (eds.) FIMH 2011. LNCS, vol. 6666, pp. 171-179. Springer, Heidelberg (2011).
Ben-Shahar, O., Zucker, S.W.: The perceptual organization of texture flow: A contextual inference approach. IEEE TPAMI 25(4) (2003).
Savadjiev, P., Strijkers, G.J., Bakermans, A.J., Piuze, E., Zucker, S.W., Siddiqi, K.: Heart wall myofibers are arranged in minimal surfaces to optimize organ function. Proc. Natl. Acad. Sci. USA 109(24), 9248-9253 (2012).
Koenderink, J.: Solid shape, vol. 2. Cambridge Univ. Press (1990).
Bayer, J., Blake, R., Plank, G., Trayanova, N.: A novel rule-based algorithm for assigning myocardial fiber orientation to computational heart models. Annals of biomedical engineering (40) 10), 2243-2254 (2012).
P. J. Olver and J. Pohjanpelto, "Maurer—Cartan forms and the structure of lie pseudo-groups," Selecta, Math., vol. 11, No. 1, pp. 99-126, 2005.
O. Faugeras, Cartan's Moving Frame Method and Its Application to the Geometry and Evolution of Curves in the Euclidean, Affine and Projective Planes. New York, NY, USA: Springer, 1994.
T. Flash and A. A. Handzel, "Affine differential geometry analysis of human arm movements," Biol. Cybern., vol. 96, No. 6, pp. 577-601, 2007.
M. Boutin and P.-L. Bazin, "Structure from motion: A new look from the point of view of invariant theory," SIAM J. Appl. Math., vol. 64, No. 4, pp. 1156-1174, 2004.
O. Ben-Shahar and S. W. Zucker, "The perceptual organization of texture flow: A contextual inference approach," IEEE Trans. Pattern Anal. Mach. Intell., vol. 25, No. 4, pp. 401-417, Apr. 2003.
P. Savadjiev, G. L. Kindlmann, S. Bouix, M. E. Shenton, and C.-F. Westin, "Local white matter geometry from diffusion tensor gradients," NeuroImage, vol. 49, No. 4, pp. 3175-3186, 2010.
E. Calabi, P. J. Olver, C. Shakiban, A. Tannenbaum, and S. Haker, "Differential and numerically invariant signature curves applied to object recognition," Int. J. Comput. Vision, vol. 26, No. 2, pp. 107-135, 1998.

P. J. Olver, "Joint invariant signatures," Found. Comput. Math., vol. 1, No. 1, pp. 3-68, 2001.
E. Piuze, J. Sporring, and K. Siddiqi, "Moving frames for heart fiber geometry," Inform. Process. Med. Imaging, vol. 23, pp. 524-535, 2013.
E. Piuze, H. Lombaert, J. Sporring, G. J. Strijkers, A. J. Backermans, and K. Siddiqi, "Atlases of cardiac fiber differential geometry," in Proc. 7th Int. Conf. Functional Imag. Modeling Heart, 2013, pp. 442-449.
P. Savadjiev, G. J. Strijkers, A. J. Bakermans, E. Piuze, S. W. Zucker, and K. Siddiqi, "Heart wall myofibers are arranged in minimal surfaces to optimize organ function," Proc. Nat. Acad. Sci. USA., vol. 109, No. 24, pp. 9248-9253, 2012.
P. Savadjiev, S. W. Zucker, and K. Siddiqi, "On the differential geometry of 3d flow patterns: Generalized helicoids and diffusion mri analysis." in Proc. Int. Conf. Comput. Vis., 2007, pp. 1-8.
H. Flanders, Differential Forms with Applications to the Physical Sciences. Mineloa, New York, USA: Dover, 2012.
W. Press, S. Teukolsky, W. Vetterling, and B. Flannery, Numerical Recipes: The Art of Scientific Computing, 3rd ed. Cambridge, U.K.: Cambridge Univ. Press, 2007.
M. J. Powell, "The BOBYQA algorithm for bound constrained optimization without derivatives," Cambridge NA Rep. NA2009/06, Univ. Cambridge, Cambridge, U.K., 2009.
T. Needham, Visual Complex Analysis. Oxford, U.K.: Clarendon, 1998.
E. Piuze, P. G. Kry, and K. Siddiqi, "Generalized helicoids for modeling hair geometry," Comput. Graph. Forum, vol. 30, No. 2, pp. 247-256, 2011.
S. H. Gilbert, A. P. Benson, P. Li, and A. V. Holden, "Regional localisation of left ventricular sheet structure: Integration with current models of cardiac fibre, sheet and band structure," Eur. J. Cardio-Thoracic Surg., vol. 32, No. 2, pp. 231-249, 2007.
Toussaint, N., Sermesant, M., Stoeck, C.T., Kozerke, S., Batchelor, P.G.: In vivo human 3D cardiac fibre architecture: reconstruction using curvilinear interpolation of diffusion tensor images. In: MICCAI (2010).
D. F. Scollan, A. Holmes, R. Winslow, and J. Forder, "Histological validation of myocardial microstructure obtained from diffusion tensor magnetic resonance imaging," Am. J. Physiol. Heart Circulatory Physiol., vol. 275, No. 6, pp. H2308-H2318, 1998.
L. Geerts, P. Bovendeerd, K. Nicolay, and T. Arts, "Characterization of the normal cardiac myofiber field in goat measured with mr-diffusion tensor imaging," Am. J. Physiol., Heart Circ. Physiol., vol. 283, pp. H139-H145, 2002.
H. Lombaert, J. Peyrat, P. Croisille, S. Rapacchi, L. Fanton, F. Cheriet, P. Clarysse, I.Magnin, H. Delingette, and N. Ayache, "Human atlas of the cardiac fiber architecture: Study on a healthy population," IEEE Trans.Med. Imag., vol. 31, No. 7, pp. 1436-1447, Jul. 2012.
J. C. Walker, J. M. Guccione, Y. Jiang, P. Zhang, A.W. Wallace, E. W. Hsu, and M. B. Ratcliffe, "Helical myofiber orientation after myocardial infarction and left ventricular surgical restoration in sheep," J. Thoracic Cardiovascular Surg., vol. 129, No. 2, pp. 382-390, 2005.
J. Chen, W. Liu, H. Zhang, L. Lacy, X. Yang, S.-K. Song, W. A. Wickline, and X. Yu, "Regional ventricular wall thickening reflects changes in cardiac fiber and sheet structure during contraction: Quantification with diffusion tensor MRI," Am. J. Physiol., Heart Circ. Physiol., vol. 289, pp. H1898-H1907, 2005.
D. Streeter and D. Bassett, "An engineering analysis of myocardial fiber orientation in pig's left ventricle in systole," Anatomical Rec., vol. 155, No. 4, pp. 503-511, 2005.
R. Deriche and D. Tschumperlé, "Diffusion PDE's on vectorvalued images: Local approach and geometric viewpoint," IEEE Signal Process. Mag., vol. 19, No. 5, pp. 16-25, 2002.
M. Martin-Fernandez, E. M. noz Moreno, L. Cammoun, J.-P. Thiran, C.-F. Westin, and C. Alberola-López, "Sequential anisotropic multichannel wiener filtering with Rician bias correction applied to 3d regularization of DWI data," Med. Image Anal., vol. 13, pp. 19-35, 2009.

(56) References Cited

OTHER PUBLICATIONS

Streeter DD, Powers WD, Alison Ross M, Torrent-Guasp F (1978) Three-dimensional fiber orientation in the mammalian heart. Cardiovascular System Dynamics (MIT Press, Cambridge, MA), pp. 73-84.

Streeter DD, Spotnitz HM, Patel DP, Ross J, Sonnenblick EH (1969) Fiber orientation in the canine left ventricle during diastole and systole. Circ Res 24:339-347.

Streeter DD, Hanna WT (1973) Engineering mechanics for successive states in canine left ventricular myocardium. II. Fiber angle and sarcomere length. Circ Res 33:656-664.

Peskin CS (1975) Mathematical Aspects of Heart Physiology (New York University.

Peskin CS (1989) Fiber architecture of the left ventricular wall: An asymptotic analysis. Commun Pur Appl Math 42:79-113.

Neville AC (1993) Biology of Fibrous Composites: Development Beyond the Cell Membrane (Cambridge Univ Press, Cambridge, UK).

Gilbert S, Benson A, Li P, Holden A (2007) Regional localisation of left ventricular sheet structure: Integration with current models of cardiac fibre, sheet and band structure. Eur J Cardiothorac Surg 32:231-249.

Blair DE, Vanstone JR (1978) A generalization of the helicoid. Minimal Submanifolds and Geodesics (Kaigai Publ, Tokyo), pp. 13-16.

Barbosa JM, Dajczer M, Jorge LP (1984) Minimal ruled submanifolds in spaces of constant curvature. Indiana U Math J 33:531-547.

Dillen F (1992) Ruled submanifolds of finite type. Proc Am Math Soc 114:795-798.

Thas C (1979) Minimal generalized ruled surfaces in the Euclidean space Em. Technical Report, Seminar of Higher Geometry (State University of Ghent, Belgium).

Thas C (1988) A property of the Veronese surface. J Geom 32:157-168.

Nitsche JJ (1989) Lectures on Minimal Surfaces: vol. 1, Introduction, Fundamentals, Geometry and Basic Boundary Value Problems (Cambridge Univ Press, Cambridge, UK).

Osserman R (2002) A Survey of Minimal Surfaces (Dover, Mineola, NY).

Savadjiev P (2009) Perceptual Organisation in Diffusion MRI: Curves and Streamline Flows. PhD thesis (McGill Univ, Montreal), p. 143.

Savadjiev P. Zucker SW, Siddiqi K (2007) On the differential geometry of 3D flow patterns: Generalized helicoids and diffusion MRI analysis. Proceedings of the IEEE 11th International Conference on Computer Vision, 10.1109/ICCV.2007.4409086.

LeGrice IJ, et al. (1995) Laminar structure of the heart: Ventricular myocyte arrangement and connective tissue architecture in the dog. Am J Physiol Heart and Circ Physiol 269:H571-H582.

Nielsen PM, LeGrice IJ, Smaill BH, Hunter PJ (1991) Mathematical model of geometry and fibrous structure of the heart. Am J Physiol Heart and Circ Physiol 260:H1365-1378.

LeGrice IJ, Hunter PJ, Smaill BH (1997) Laminar structure of the heart: A mathematical model. Am J Physiol Heart and Circ Physiol 272:H2466-H2476.

Piuze E, Kry PG, Siddigi K (2011) Generalized helicoids for modeling hair geometry. Comput Graph Forum 30:247-256.

Hayden HA (1931) On a generalized helix in a Riemannian n-space. Proc Lond Math Soc s2-32:337-345.

Jones DK, ed. (2010) Diffusion MRI: Theory, Methods, and Applications (Oxford Univ Press, New York).

Chen J, et al. (2005) Regional ventricular wall thickening reflects changes in cardiac fiber and sheet structure during contraction: Quantification with diffusion tensor MRI. Am J Physiol Heart and Circ Physiol 289:H1898-H1907.

Hsu EW, Muzikant AL, Matulevicius SA, Penland RC, Henriquez CS (1998) Magnetic resonance myocardial fiber-orientation mapping with direct histological correlation. Am J Physiol Heart and Circ Physiol 274:H1627-H1634.

Tseng W-Yi,Wedeen VJ, Reese TG, Smith RN, Halpern EF (2003) Diffusion tensor MRI of myocardial fibers and sheets: Correspondence with visible cut-face texture. J Magn Reson Imaging 17:31-42.

Coghlan C, Hoffman J (2006) Leonardo da Vinci's flights of the mind must continue: Cardiac architecture and the fundamental relation of form and function revisited. Eur J Cardiothorac Surg 29(Suppl 1):S4-17.

Fisher RA (1953) Dispersion on a sphere. Proc R Soc London Ser A 217:295-305.

Spotnitz HM (2000) Macro design, structure, and mechanics of the left ventricle. J Thorac Cadiovasc Surg 119:1053-1077.

Aelen FW, et al. (1997) Relation between torsion and cross-sectional area change in the human left ventricle. J Biomech 30:207-212.

Arts T, Veenstra PC, Reneman RS (1984) Torsion of the left ventricle during the ejection phase in the intact dog. Cardiovasc Res 18:183-193.

Lumens J, Delhaas T, Arts T, Cowan BR, Young AA (2006) Impaired subendocardial contractile myofiber function in asymptomatic aged humans, as detected using MRI. Am J Physiol Heart Circ Physiol 291:H1573-H1579.

Bouligand Y (1972) Twisted fibrous arrangements in biological materials and cholesteric mesophases. Tissue Cell 4:189-217.

Jawad H, Lyon AR, Harding SE, Ali NN, Boccaccini AR (2008) Myocardial tissue engineering. Br Med Bull 87:31-47.

Tseng W-YI, Dou J, Reese TG,Wedeen VJ (2006) Imaging myocardial fiber disarray and intramural strain hypokinesis in hypertrophic cardiomyopathy with MRI. J Magn Reson Imaging 23:1-8.

Strijkers GJ, et al. (2009) Diffusion tensor imaging of left ventricular remodeling in response to myocardial infarction in the mouse. NMR Biomed 22:182-190.

Jones DK, Horsfield MA, Simmons A (1999) Optimal strategies for measuring diffusion in anisotropic systems by magnetic resonance imaging. Magn Res Med 42:515-525.

Borgefors G (1984) Distance transformations in arbitrary dimensions. Comput Vision Graph 27:321-345.

Athanasuleas, C.L., Buckberg, G.D., Stanley, A.W., Siler, W., Dor, V., Di Donato, M., Menicanti, L., De Oliveira, S.A., Beyersdorf, F., Kron, I.L., et al.: Surgical ventricular restoration in the treatment of congestive heart failure due to post-infarction ventricular dilation. Journal of the American College of Cardiology 44(7), 1439{1445 (2004).

Piuze, E., Lombaert, H., Sporring, J., Siddiqi, K.: Cardiac fiber inpainting using cartan forms. In: Medical Image Computing and Computer-Assisted Intervention MICCAI 2013, pp. 509-517. Springer (2013).

Rios, L.M., Sahinidis, N.V.: Derivative-free optimization: A review of algorithms and comparison of software implementations. Journal of Global Optimization 56(3), 1247{1293 (2013).

Sengupta, P.P., Korinek, J., Belohlavek, M., Narula, J., Vannan, M.A., Jahangir, A., Khandheria, B. K.: Left ventricular structure and function: basic science for cardiac imaging. Journal of the American College of Cardiology 48(10), 1988-2001 (2006).

Song, K., Nam, Y.J., Luo, X., Qi, X., Tan, W., Huang, G.N., Acharya, A., Smith, C.L., Tallquist, M.D., Neilson, E.G., et al.: Heart repair by reprogramming non-myocytes with cardiac transcription factors. Nature 485 (7400), 599-604 (2012).

\* cited by examiner

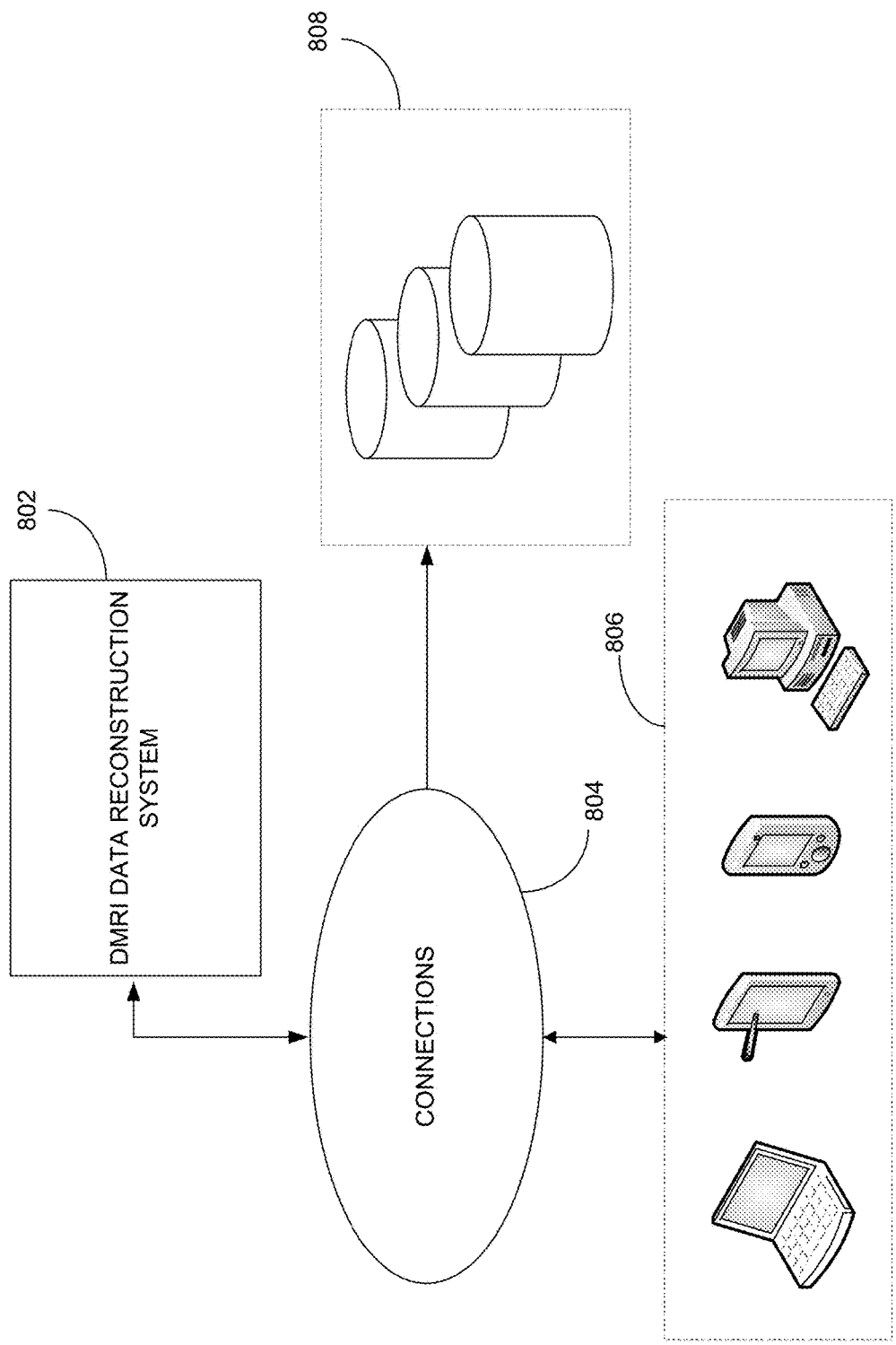

RECOVERY OF MISSING INFORMATION IN DIFFUSION MAGNETIC RESONANCE IMAGING DATA

CROSS-REFERENCE TO RELATED APPLICATIONS

This application claims priority under 35 U.S.C. 119(e) to U.S. application No. 62/160,694 filed May 13, 2015, entitled "Methods of Modelling and Characterizing Heart Geometry", the entire contents of which are hereby incorporated by reference.

TECHNICAL FIELD

The present invention relates to the field of data reconstruction in imaging, and particularly to recovering three-dimensional data that are missing or damaged from diffusion magnetic resonance imaging (dMRI) data.

BACKGROUND OF THE ART

Medical imaging is a growing field as the technology available to create visual representations of the interior of a body continues to advance. Such visual representations may be used for clinical analysis and/or medical intervention, as they reveal internal structures that are hidden by skin and bones.

Many different imaging techniques may be used to image the cardiovascular system, such as echocardiography, cardiac computed-tomography (CT), and magnetic resonance imaging (MRI). One particular imaging method well-suited for the cardiovascular system is Diffusion MRI (dMRI), which uses the Brownian motion of water molecules to generate contrast in magnetic resonance images. dMRI allows for the mapping of the diffusion process of molecules in biological tissues. The water molecule diffusion patterns can reveal microscopic details about tissue architecture in the heart.

As with any imaging technique, there are challenges associated with missing or damaged data points when reconstructing organs based on dMRI data. Among the presently available techniques for recovering missing information in dMRI are the interpolation of the diffusion tensor or the diffusion signal itself, and the application of rule-based methods. Each known method has its drawbacks, particularly with regards to recovering fiber orientation in regions where the data are missing or have been corrupted.

Therefore, there is room for improvement.

SUMMARY

There is described herein a method for recovering missing information in diffusion magnetic resonance imaging (dMRI) data. The data are modeled according to the theory of moving frames and regions where frame information is missing are reconstructed by performing diffusions into the regions. Local orthogonal frames computed along the boundary of the regions are rotated into the regions. Connection parameters are estimated at each new data point obtained by a preceding rotation, for application to a subsequent rotation.

In accordance with a first broad aspect, there is provided a method for recovering missing information in diffusion magnetic resonance imaging (dMRI) data. At each data point of the dMRI data, a local orthogonal frame is fitted and expressed as (i, j, k) to represent three directions. Connection parameters $c_{ijk}$ are determined at each data point to represent a rotation of the local orthogonal frame in a spatial neighborhood of the data point in accordance with the dMRI data. Inward diffusions are then performed into one or more regions where frame information is missing. The diffusions comprise rotating the local orthogonal frame in a heading direction at data points starting along a boundary of the region and moving into the region, and estimating connection parameters $c_{ijk}$ at each new data point obtained by a preceding rotation of the local orthogonal frame, for application to a subsequent rotation of the local orthogonal frame at the new data point.

In some embodiments, rotating the local orthogonal frame comprises computing new values for the three directions (i, j, k) independently.

In some embodiments, the method further comprises adjusting the computed new values to enforce orthogonality of the three directions (i, j, k).

In some embodiments, determining connection parameters $c_{ijk}$ at each data point of the dMRI data comprises computing closed-form connections in linear space.

In some embodiments, estimating connection parameters $c_{ijk}$ at each new data point comprises selecting a computation scheme from a group comprising finite differentiation, energy minimization, and closed-form connections in linear space.

In some embodiments, selecting the computation scheme comprises selecting as a function of local parameters of each one of the new data points.

In some embodiments, performing inward diffusions into a region of missing information comprises rotating the local orthogonal frame and estimating the connection parameters $c_{ijk}$ for a plurality of layers of the region in an iterative fashion.

In some embodiments, each one of the plurality of layers has a thickness corresponding to one voxel.

In some embodiments, fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

In some embodiments, the region is a volumetric region or a distributed region, and wherein missing information is recovered for a plurality of regions in the heart wall in order to reconstruct a three-dimensional image of fiber orientations.

In accordance with another broad aspect, there is provided a system for recovering missing information in diffusion magnetic resonance imaging (dMRI) data. The system comprises a processing unit and a non-transitory memory communicatively coupled to the processing unit and comprising computer-readable program instructions. The instructions are executable by the processing unit for fitting, at each data point of the dMRI data, a local orthogonal frame expressed as (i, j, k) to represent three directions; determining connection parameters $c_{ijk}$ at each data point to represent a rotation of the local orthogonal frame in a spatial neighborhood of the data point in accordance with the dMRI data; and performing inward diffusions into one or more regions where frame information is missing. The diffusions comprise rotating the local orthogonal frame in a heading direction at data points starting along a boundary of the region and moving into the region, and estimating connection parameters $c_{ijk}$ at each new data point obtained by a preceding rotation of the local orthogonal frame, for application to a subsequent rotation of the local orthogonal frame at the new data point.

In some embodiments, rotating the local orthogonal frame comprises computing new values for the three directions (i, j, k) independently.

In some embodiments, the program instructions are further executable for adjusting the computed new values to enforce orthogonality of the three directions (i, j, k).

In some embodiments, determining connection parameters $c_{ijk}$ at each data point of the dMRI data comprises computing closed-form connections in linear space.

In some embodiments, estimating connection parameters $c_{ijk}$ at each new data point comprises selecting a computation scheme from a group comprising finite differentiation, energy minimization, and closed-form connections in linear space.

In some embodiments, selecting the computation scheme comprises selecting as a function of local parameters of each one of the new data points.

In some embodiments, performing inward diffusions into a region of missing information comprises rotating the local orthogonal frame and estimating the connection parameters cijk for a plurality of layers of the region in an iterative fashion.

In some embodiments, each one of the plurality of layers has a thickness corresponding to one voxel.

In some embodiments, fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

In some embodiments, the region is a volumetric region or a distributed region, and wherein missing information is recovered for a plurality of regions in the heart wall in order to reconstruct a three-dimensional image of fiber orientations.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
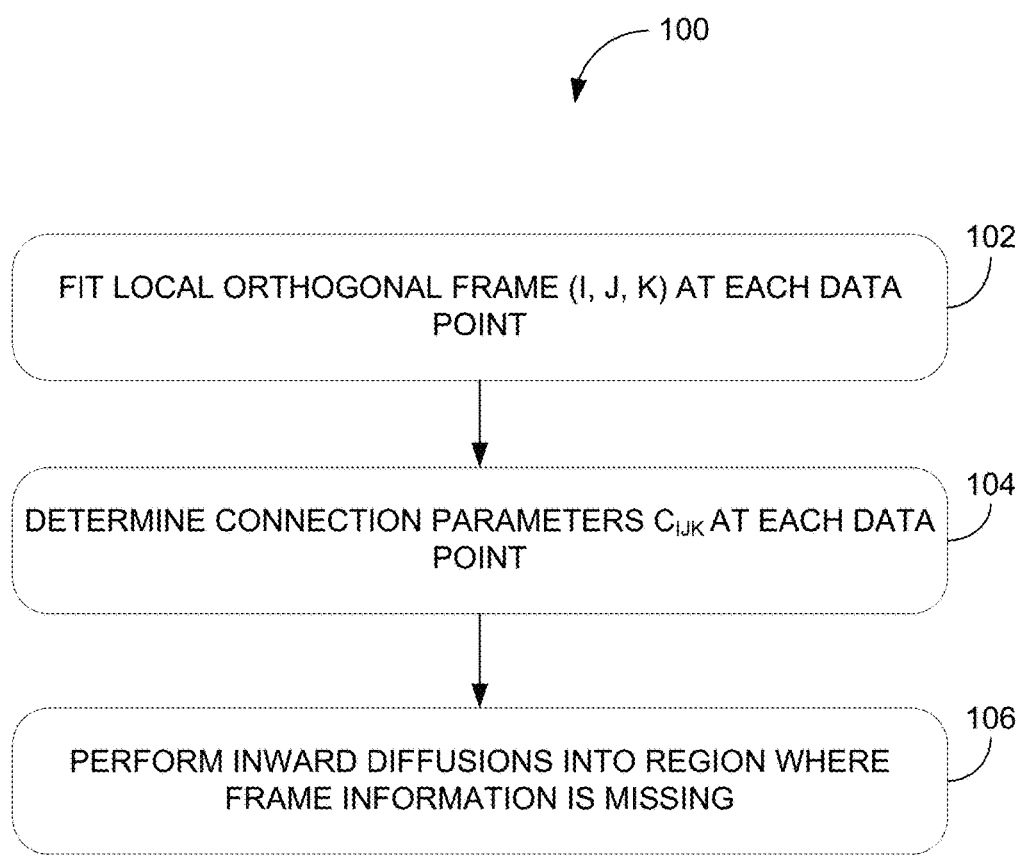
FIG. 1 is a flowchart of an exemplary computer-implemented method for recovering missing information in diffusion magnetic resonance imaging (dMRI) data.

There is illustrated in FIG. 1 a flowchart of a computer-implemented method 100 for recovering missing information in diffusion Magnetic Resonance Imaging (dMRI) data. The method 100 is based on modelling the dMRI data in accordance with the theory of moving frames. Step 102 comprises fitting, at each data point of the dMRI data, a local orthogonal frame expressed as (i, j, k) to represent three directions. Step 104 comprises determining connection parameters $c_{ijk}$ at each data point to represent the rotation of the local orthogonal frame in the spatial neighborhood of the data point, so as to best fit the dMRI data. Steps 102 and 104 are presented mathematically below.

Let a point $x = \Sigma_i x_i e_i \in \Re^3$ be expressed in terms of $e_1$, $e_2$, $e_3$, the natural basis for $\Re^3$. Next, we define a right-handed orthonormal frame field $f_1, f_2, f_3 : \Re^3 \to \Re^3$. Each frame axis can be expressed by the rigid rotation $f_i = \Sigma_j a_{ij} e_j$ where $A = \{a_{ij}\} \in \Re^{3 \times 3}$ is a differentiable attitude matrix such that $A^{-1} = A^T$. Treating $f_i$ and $e_i$ as symbols, we can write Equation (1) below. Further, since each $e_i$ is constant, the differential geometry of the frame field is completely characterized by A. Taking the exterior derivative on both sides yields Equation (2) where d denotes the exterior derivative, and $C = (dA)A^{-1} = \{c_{ij}\} \Re^{3 \times 3}$ is the Maurer-Cartan matrix of connection forms $c_{ij}$. Writing $f_i$ as symbols, then Equation (2) can be understood as $df_i = \Sigma_j c_{ij} f_j$.

$$[f_1, f_2, f_3]^T = A[e_1 e_2 e_3]^T \tag{1}$$

$$d[f_1, f_2, f_3]^T = (dA)A^{-1}[f_1, f_2, f_3]^T = C[f_1, f_2, f_3]^T \tag{2}$$

$$C = \begin{bmatrix} 0 & c_{12} & c_{13} \\ -c_{12} & 0 & c_{23} \\ -c_{13} & -c_{23} & 0 \end{bmatrix} \tag{3}$$

$$\tilde{f}_i(x_0 + v) = f_i + df_i \langle v \rangle + \partial(\|v\|^2) \approx f_i + \sum_{j \neq i} f_j \sum_k v_k c_{ijk} \tag{4}$$

The Maurer-Cartan matrix is a skew symmetric and hence referring to Equation (3) there are at most 3 independent, non-zero one-forms: $c_{12}$, $c_{13}$, and $c_{23}$. One-forms operate on tangent vectors through a process denoted contraction, written as $dw\langle v \rangle \in \Re$ for a general one-form $dw\langle v \rangle = \Sigma_i w_i de_i$ and tangent vector v on $\Re^3$, which yields $dw\langle v \rangle = \Sigma_i w_i de_i \langle \Sigma_j v_j e_j = \Sigma_i w_i v_i$ since $de_i \langle e \rangle = \delta_{ij}$, where $\delta_{ij}$ is the Kronecker delta.

Figure 2A:
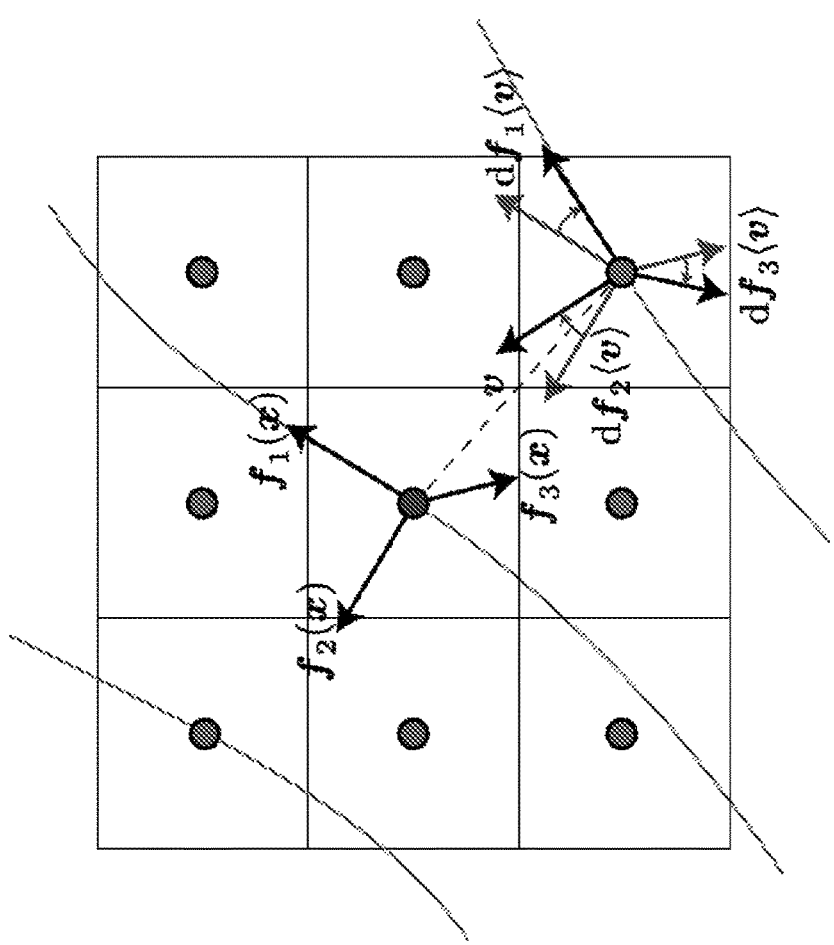
FIG. 2A illustrates the turning of frame axes at x expressed in the local basis $f_1$, $f_2$, $f_3$ when x moves in the direction v.
Figure 2B:
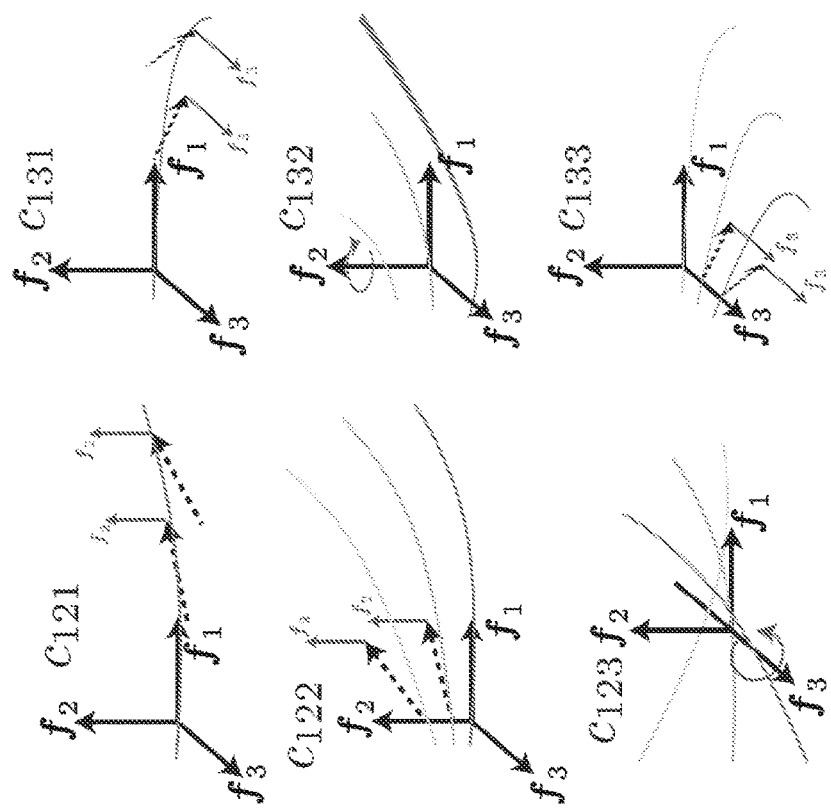
FIG. 2B illustrates frame field variation characterized by the connections $c_{ijk}$ for i=1.

The space of linear models for smooth frame fields is fully parametrized by the one-forms $c_{ij}$. This space can be explored by considering the motion of $f_i$ in a direction $v=\Sigma_k v_k f_k$ using the first order terms of a Taylor series centered at $x_0$ as given by Equation (4) where $f_i$ and $df_i$ are evaluated at $x_0$, and $c_{ijk} \equiv c_{ij}\langle f_k \rangle$ are the connection forms of the local frame. Since only 3 unique non-zero combinations of $c_{ij}$ are possible, there are in total 9 connections $c_{ijk}$. These coefficients express the rate of turn of the frame vector $f_i$ towards $f_j$ when x moves in the direction $f_k$. Referring to FIGS. 2A and 2B, there is illustrated the behavior of the frame field described by $c_{ijk}$. For example, with $f_1$ taken to be the local orientation of a fiber and $f_3$ taken to be the component of the heart wall normal orthogonal to $f_1$, then $c_{131}$ measures the circumferential curvature of a fiber and $c_{123}$ measures the change in its helix angle. FIG. 2A illustrates the turning of frame axes at x expressed in the local basis $f_1$, $f_2$, $f_3$ when x moves in the direction v. FIG. 2B illustrates the frame field variation characterized by the connections $c_{ijk}$ for i=1.

A first order generator for frame fields using Equation (4) requires knowledge of the underlying connection forms $c_{ijk}$. Three different ways of computing the connection forms $c_{ijk}$ may be used. The computation schemes are referred to herein as finite differentiation, energy minimization, and closed-form connections in linear space.

The finite differentiation computation scheme is a direct estimate based on finite differences. In smooth frame fields, the connection one-forms $c_{ij}$ can be directly obtained using Equation (2), i.e., $df_i \cdot f_k = (\Sigma_j^3 c_{ij} f_j) \cdot f_k = \Sigma_j^3 c_{ij} \delta_{jk} = c_{ik}$. The differentials $df_i$ can be computed by applying the exterior derivative for a function, i.e., for the k'th component $f_{ik}$, $f_{ik}: \Re^3 \rightarrow \Re$, $$df_{ik} = \sum_l^3 \frac{\delta f_{ik}}{\delta x_l} de_l$$

as given by Equation (5) where $$J_i = \left[\frac{\delta f_{ip}}{\delta x_q}\right] \in \Re^{3 \times 3}$$

is the Jacobian matrix of partial derivatives of $f_i$. Now setting $v=f_k$ we obtain Equation (6). The Jacobian matrix $J_i$ can be approximated to first order using, e.g., finite differences on $f_i$ with a spacing of size $\delta x$:

$$\frac{\delta f_{ij}}{\delta x_k}(x) \approx \frac{f_{ij}(x+e_k) - f_{ij}(x)}{\delta x}.$$

$$df_i \cdot f_j \langle v \rangle = f_j^T df_i \langle v \rangle = \sum_k^3 \sum_l^3 f_{jk} \frac{\delta f_{ik}}{dx_l} de_l \langle v \rangle = f_j^T J_i v \quad (5)$$

$$c_{ijk} = f_j^T J_i f_k \quad (6)$$

The energy minimization computation scheme is a regularized optimization scheme. The connection forms $c_{ijk}$ at $x_0$ can be obtained as the minimizer of an extrapolation energy $\xi$ contained within a neighborhood $\Omega$ as given by Equation (7) where $\lambda$ is a regularization weight used to penalize high curvature. Denoting $\tilde{f}_i$ as the normalized approximation to $f_i$ at $x_0+v$ using Equation (4) then we can choose $\xi$ to minimize the angular error between $\tilde{f}_i$ and $f_i$:

$$\xi(x_0, \Omega) = \frac{1}{|\Omega|} \sum_{v \in \Omega} \sum_i^3 \Box \varepsilon_i(x_0 + v),$$

with $\varepsilon_i(x_0+v) = \text{ar cos}(f_i(x_0+v) \cdot \tilde{f}_i(x_0+v))$.

$$c_{ijk}^*(x_0) = \underset{c_{ijk}}{\text{argmin}} \xi(x_0, \Omega) + \lambda |c_{ijk}| \quad (7)$$

The closed form connections in linear space computation scheme is based on trigonometrical considerations in the first-order structure of 3D frame fields and enforces the requirement that $c_{ij}\langle v \rangle = \Sigma_k c_{ijk} v_k$. This requirement is not explicitly enforced in the finite differentiation and energy minimization computation schemes. The closed form connections in linear space computation scheme also provides exact $c_{ijk}$ measurements in manifolds that have low second-order curvatures ($d^2 f_i \rightarrow 0$). Given a local basis $f_i$ and data-driven neighboring bases $f_i(v \in \Omega)$, the one-forms $c_{ij}\langle v \rangle$ can be solved for using linear least-squares. We begin by expanding Equation (4) to yield Equation (8) and analyze this expression geometrically using FIG. 3.

$$f_i(v) = f_i + c_{ij}\langle v \rangle f_j + c_{ik}\langle v \rangle f_k \quad (8)$$

Let $f\{(v)\}$ denote the projection of $f_i(v)$ in the $f_i$–$f_j$ plane, i.e. $f_i^j(v) = f_i(v) - (f_i(v) \cdot f_k) f_k$, $k \in (1,2,3) \neq i \neq j$ and let $\theta_{ij}(v)$ denote the signed angle between $f_i$ and $f_i^j(v)$ with positive values assigned to $\theta_{ij}(v)$ rotating $f_i$ towards $f_j$, obtained as Equation (9). Using trigonometry, we obtain Equation (10). Then by expanding the contraction $c_{ij}\langle v \rangle$ we obtain Equations (11) to (13) which when substituted into Equation (10) yield Equation (14) wherein we have a linear system in the nine unknowns $c_{ijk}$. Now, aggregating n measurements $v_i \in \Omega(x)$ yields Equation (15).

$$\theta_{ij}(v) = \text{sgn}(f_i^j(v) \cdot f_j) \cdot \arccos\left(\left|\frac{f_i \cdot f_i^j(v)}{\|f_i^j(v)\|}\right|\right) \quad (9)$$

$$\tan(\theta_{ij}(v)) = \frac{c_{ij}(v)}{\|f_i\|} = c_{ij}\langle v \rangle \text{ since } f_i \text{ is a unit vector} \quad (10)$$

$$c_{ij}\langle v \rangle = (v \cdot f_1)c_{ij1} + (v \cdot f_2)c_{ij2} + (v \cdot f_3)c_{ij3} \quad (11)$$

$$= v_1 c_{ij1} + v_2 c_{ij2} + v_3 c_{ij3} \quad (12)$$

with $v_k \equiv v \cdot f_k$ $$\Rightarrow [c_{12}\langle v \rangle c_{13}\langle v \rangle c_{23}\langle v \rangle] = [v_1 v_2 v_3] \cdot \begin{bmatrix} c_{121} & c_{131} & c_{231} \\ c_{122} & c_{132} & c_{232} \\ c_{123} & c_{133} & c_{233} \end{bmatrix} \quad (13)$$

$$\begin{bmatrix} v_1 \\ v_2 \\ v_3 \end{bmatrix}^T \begin{bmatrix} c_{121} & c_{131} & c_{231} \\ c_{122} & c_{132} & c_{232} \\ c_{123} & c_{133} & c_{233} \end{bmatrix} = \begin{bmatrix} \tan(\theta_{12}(v)) \\ \tan(\theta_{13}(v)) \\ \tan(\theta_{23}(v)) \end{bmatrix}^T \quad (14)$$

-continued $$\begin{bmatrix} v_{11} & v_{12} & v_{13} \\ \ldots & \ldots & \ldots \\ v_{i1} & v_{i2} & v_{i3} \\ \ldots & \ldots & \ldots \\ v_{n1} & v_{n2} & v_{n3} \end{bmatrix} \begin{bmatrix} c_{121} & c_{131} & c_{231} \\ c_{122} & c_{132} & c_{232} \\ c_{123} & c_{133} & c_{233} \end{bmatrix} = \begin{bmatrix} \tan(\theta_{12}(v_1)) & \tan(\theta_{13}(v_1)) & \tan(\theta_{23}(v_1)) \\ \ldots & \ldots & \ldots \\ \tan(\theta_{12}(v_i)) & \tan(\theta_{13}(v_i)) & \tan(\theta_{23}(v_i)) \\ \ldots & \ldots & \ldots \\ \tan(\theta_{12}(v_n)) & \tan(\theta_{13}(v_n)) & \tan(\theta_{23}(v_n)) \end{bmatrix} \quad (15)$$

Accordingly, we require n≥3 otherwise the system will be undetermined. In general, $v_i \cdot v_j \neq 0$ such that V is not a full row rank. A QR factorization or singular value decomposition (SVD) pseudoinverse process can be used to solve for C $C=(V^T V)^{-1} V^T \tilde{C}$.

Figure 4:
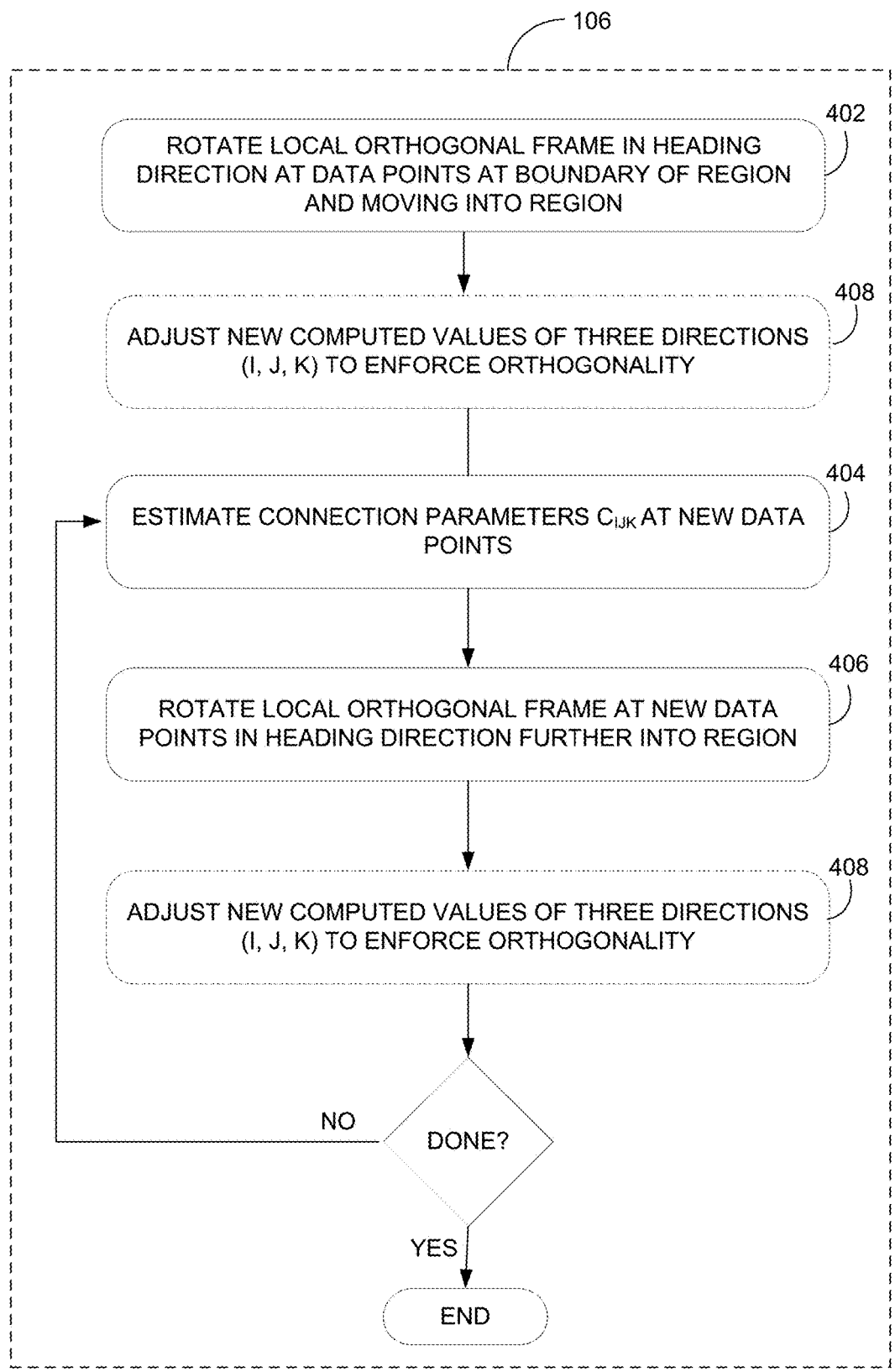
FIG. 4 is a flowchart of an example embodiment of the method of inward diffusion for regions having missing frame information.

Referring back to FIG. 1, once the dMRI data have been modeled in accordance with the theory of moving frames, and more specifically that local orthogonal frames are fitted at each data point, as per step 102, and connection parameters $c_{ijk}$ are computed at each data point, as per step 104, the method 100 moves on to step 106 of performing inward diffusions into one or more regions where frame information is missing. An example embodiment of step 106 is illustrated in FIG. 4.

The region of missing information may be a volumetric region or a distributed region. In some data sets, there may be a combination of volumetric regions and distributed regions for which frame information is missing. The regions may be reconstructed sequentially or in parallel.

Each region is defined by a boundary and inward diffusions are performed starting from the boundary and into the region. As per step 402, each local orthogonal frame is rotated in a heading direction for the data points at the boundary of the region. New values for the three directions (i, j, k) are computed at the new data points. At step 404, connection parameters $c_{ijk}$ are estimated at each new data point obtained by the rotation of step 402. The estimated parameters $c_{ijk}$ are then used to further rotate the local orthogonal frames into the region, as per step 406.

In some embodiments, the method 106 is performed iteratively, in a layer-by-layer fashion. For example, if the region to be reconstructed were to be spherical, then the layers would be concentric spherical shells of decreasing diameters. For a non-spherical region, the layers may have a shape that corresponds to the shape of the boundary of the region. The layers may be set out evenly, such that each layer has a same thickness, or they may be set out unevenly, such that the thickness varies from one layer to another. Similarly, a given layer may have a constant thickness or a thickness that varies throughout the layer. The thickness of each layer may be set as desired, for example at one voxel, two voxels, three voxels, and the like.

Alternatively, the region is divided into a plurality of sub-regions, and the inward diffusions are performed separately in each sub-region. The order of diffusion for the sub-regions may be set in accordance with available data points from the dMRI data, such that a first rotation of the local frames as per step 402 is performed from known data points. This embodiment may be more suitable for distributed regions, whereas the layer-by-layer approach may be favored for volumetric regions. Other approaches for performing the inward diffusion of regions where frame information is missing may also be used.

In some embodiments, rotating the local orthogonal frame comprises computing new values for the three directions (i, j, k) independently. There may be a need to adjust the newly computed values of the three directions (i, j, k) so as to enforce orthogonality, as per step 408. As illustrated in FIG. 4, step 408 may be performed after the first rotation from the data points on the boundary of the region, and/or it may be performed after each additional rotation from a new data point further into the region.

Step 106 of inward diffusions into regions where frame information is missing will now be described mathematically. We define $\Omega$ as a region where frame field data are available, and A as a reconstruction domain. Starting with $A^0=A$ each iteration propagates information on the boundary $\delta A^n$ such that $\delta A^{n+1}=\delta A^n \otimes B_r$ is eroded with a ball element $B_r$ of radius r=1 and $c_{ijk}$ is updated in $\Omega$ and $\vartheta A^{n+1}$ until $A^{n+1}=\vartheta$. Frames $f_i$ are transported from $x \in \delta A^n$ in a direction v across $\delta A$ using a neighbor accumulation of Equation (4) as given by Equation (16) which is then normalized.

$$\tilde{f}_i^{n+1}|_{x+v} = \sum_{x \in \delta A^n} \left( f_i^n \Big|_x + \sum_{j \neq i} f_j^n \Big|_x \sum_k c_{ijk}(x+v) \cdot f_k^n \Big|_x \right) \quad (16)$$

In some embodiments, connection forms $c_{ijk}$ at $x \in \delta A^n$ are obtained by combining the three computation schemes described above, namely finite differentiation, energy minimization, and closed-form connections in linear space. For each data point, the computation scheme may be selected based on the following heuristics in Equation (17), where $k=\|V^1\|_F\|V\|_F$ is the condition number of V in Equation (15) and F is the Frobenius norm where $N=\frac{1}{2}(2r+1)^3$ and $\kappa_0=3$ were determined empirically and generally offer a good tradeoff between neighborhood connectivity and well-conditioning of V.

$$c_{ijk}(x) = \begin{cases} \text{Closed form of Equation (15): } x > N \text{ neighbours} \\ \quad \text{and } \kappa < \kappa_0 \\ \text{Energy of Equation (7): } \lambda = 0.0001 \text{ \& seeding} \\ \text{with Equation (6): else} \end{cases} \quad (17)$$

Note that unrealistically large $c_{ijk}$ values can still arise in spite of the regularization. To see this, take $f_1(x)$ and make it parallel to $f_2(x)$ in a neighboring voxel. Using Equation (4) we have $f_1(v) \approx f_2 + c_{12}(v) f_2 + c_{13}(v) f_3 m$ such that $f_1(v) \| f_2(v) \Rightarrow c_{12}\langle v \rangle \to \infty$.

In some embodiments, a hard threshold may be applied on $\xi$ and $c_{ijk}$ in Equation (17). To do this we set $$c_{ijk} = 0 \text{ if } \xi > \frac{\pi}{4}$$

or if $c_{ijk}$ exceeds bounds obtained as follows. In the discrete case using forward differences, the frame axis differential $d(f_{i1}e_1+f_{i2}e_2+f_{i3}e_3)$ is bounded by $$\left| \frac{\delta f_i}{\delta x_k} \right| \approx \frac{1}{2} |f_{ij}(x+e_k) - f_{ij}(x)| \leq 1$$

and $\|f_i\|=1$. We thus have $|c_{ij}\langle v \rangle|=|f_j^T \mathfrak{I}_{f_i}(x_1,x_2,x_3)v| \leq f_j^T \cdot [\|v\|_1 \|v\|_2 \|v\|_3]^T \leq \|v\|_1$, and set $c_{ijk}=\min(c_{ijk},\|v\|_1)$.

The diffusion process guided by Equations (16) and (17) does not enforce orthogonality of the resulting frame field. Since this is a first-order method, there may be some orthogonality drift as the process gets deeper into the region A. To see this, using Equation (8), we get $$f_1(v) \cdot f_2(v) = (f_1 + c_{12}(v)f_2 + c_{13}(v)f_3) \cdot (f_3 + c_{21}(v)f_1 c_{23}(v)f_3) \quad (10)$$

and similarly for the other axis products. Since $f_i$ is by definition orthogonal at 0, we have $f_i \cdot f_j = \delta_{ij}$ such that $$f_i(v) \cdot f_2(v) = \begin{cases} 1 + c_{ij}^2 + c_{ik}^2 : i = j \\ c_{ik} c_{jk} : i \neq j \end{cases} \text{ for } k \neq i, k \neq j.$$

The extrapolated frame $f_i(v)$ will therefore never be exactly orthonormal. To enforce orthonormality we therefore fix $f_1(v)$ and find its orthogonal complement $f^{\frac{1}{2}}(v)$ using Equations (18) and (19) where $c_{ij}$ is taken as $c_{ij}(v)$. We similarly proceed with $f^{\frac{1}{3}}(v)$.

$$f\frac{1}{2}(v) = f - (f_1(v) \cdot f_2(v))f_1(v) \quad (18)$$

$$= (-c_{12} - c_{13}c_{23})f_1 + (1 - c_{13}c_{23}c_{13})f_2 + (c_{23} - c_{13}^2 c_{23})f_3 \quad (19)$$

The method 100 may be applied to reconstruction of various internal organs, such as, but not limited to the brain, the kidney and the pancreas. In some embodiments, the method 100 is applied to cardiac fiber reconstruction, i.e. the heart. For example, the dMRI data may be used to obtain a first direction for the local orthogonal frames whereas the other two directions are based on the local geometry of a heart wall. Therefore, the method 100 may be used to reconstruct a three-dimensional image of fiber orientations.

Given a partial volume $\Omega$ of fiber orientations $f_1$ in a mask H of the heart, $f_1$ may be reconstructed everywhere in $A=H-\Omega$. For cardiac fiber reconstruction, step 106 of method 100 may be guided by rule-based priors for fiber orientations based on H and estimated heart wall normal directions of which one relates to the circumferential arrangement of myofibers and the other to their helix angle turning.

The circumferential component may be estimated as follows. Using a smoothing kernel $G_\sigma$, the Euclidean distance transforms $G_\sigma*D_+$ and $G_\sigma*D_-$ to the outer and inner walls are first computed. From the average $D=\frac{1}{2}(D_+-D_-)$ local wall normal directions are computed using $\hat{f}_3=\nabla D$. The apex $\xi_0$ and an upward $\hat{u}$ are identified, and used to obtain heart centerline measurements $\xi_t$ parametrized over t steps along $\hat{u}$, such that:

$$\xi_t = \frac{\sum_x w(x)\Xi(x)x}{\sum_x w(x)\Xi(x)x}, \text{ where } \Xi(x) = \text{sgn}(|(x - \xi_0 - t\hat{u}) \cdot \hat{u}|)$$

In other words, $\Xi(x)$ is 1 in the current short axis plane and 0 elsewhere, and:

$$w(x) = \begin{cases} 1: x \text{ in\_the\_myocardian} \\ 0: \text{ else} \end{cases}.$$

Then, a smooth heart centerline is obtained as $L(t)=G_\sigma * \xi_t$. We can now obtain a local long-axis direction $f_L$ using $$f_L = \frac{\delta L(t)}{\delta t}$$

and finally estimate the circumferential direction $f_C$ from the cross product of $f_L$ and the local wall normal $\hat{f}_3$ as $f_C=f_L \times f_3$.

The helical component may be estimated as follows. A rule-based helix angle variation prior is used, from $\alpha^+$ to $\alpha^-$ from outer to inner wall. A voxel x is first parametrized over the local depth of the heart wall in the range [0, 1], where 0 indicates that the voxel is lying on the outer wall and $f_L$ on the inner wall, using:

$$\gamma(x) = \frac{D_+}{D_+ + D_-}(x) = (1 + D_- D_x^{-1})^{-1}(x) \in [0, 1]$$

Then, the local helix angle at x is linearly interpolated using:

$$a(x)=(\alpha_+-y\alpha_++y\alpha_-)(x).$$

Finally, the helix fiber direction $\hat{f}_1$ is obtained using a helical rotation of $f_c$ about the local transmural axis $\hat{f}_3$ from the axis angle $\langle \hat{f}_3,\alpha \rangle$ using Rodrigues' formula:

$$\hat{f}_1=\cos \alpha f_C+\sin \alpha(\hat{f}_3 \times f_C)+(1-\cos \alpha)(\hat{f}_3 \cdot f_C)\hat{f}_3$$

Each diffusion pass n+1 combines current frame field estimates $f_i$, differentials $df_i$ and rule-based priors $\hat{f}_i$ using $$\tilde{f}_1^{n+1} = \phi_1 \hat{f}_1(x) + (1 - \phi) \sum_{y \in \partial A} (\tilde{f}_1^n + c_{12}\langle v \rangle \tilde{f}_2^n + c_{13}\langle v \rangle \tilde{f}_3^n)$$

$$\tilde{f}_1^{n+1} = \phi_0(\tilde{f}_3 - (\tilde{f}_3 \cdot \tilde{f}_1^n)\tilde{f}_1^n) + (1 - \phi_3 \tilde{f}_3^n(x)), \tilde{f}_2^{n+1} = \tilde{f}_3^{n+1} \times \tilde{f}_1^{n+1}$$

Here, $v=x-y$, $\delta\Omega(x)$ denotes the current (diffused) boundary around x from which data are recovered, and $\phi_1=0.1$, $\phi_3=0.7$ are prior weights determined empirically. The higher the confidence in the rule-based model, the larger these coefficients should be. Each $\hat{f}_i^{n+1}$ is normalized after each diffusion pass.

Damaged diffusion volumes were simulated using Poisson disk stochastic sampling, where each sample point p satisfies a minimum distance constraint to others. At p, an ellipsoid with random semi-axis lengths (range=: 1 to 10 voxels) is carved out. A prototypical synthetic in vivo mask was also obtained by regularly slicing H along its long-axis. The corruptions were applied to dMRI volumes of a healthy rat heart. Subsequently, the method 100 was compared against a standard vector interpolation scheme based on distance weighting, against a pure vector diffusion scheme using Equation (16) with $c_{ijk}=0$, and against a ruled-based model. The robustness to noise was also tested by combining Poisson sampling and random angular perturbations to $f_1$, prior to reconstruction.

Figure 5:
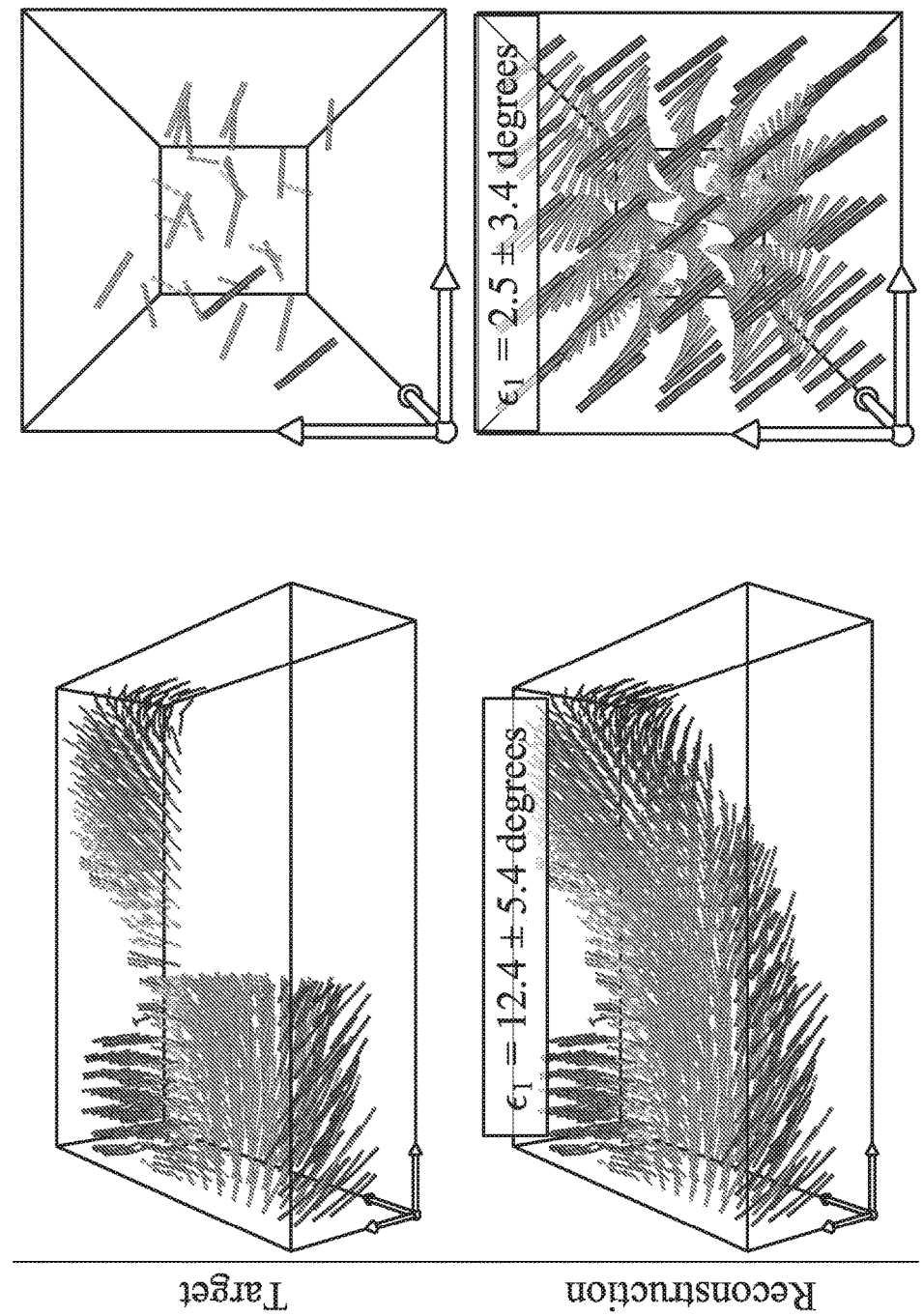
FIG. 5 illustrates reconstructed volumes and errors using the proposed method for a damaged portion of a rat short axis slab and a sparse rule-based synthetic field.

FIG. 5 depicts the reconstruction of synthetic cardiac fiber fields respectively generated in a short axis slab near the mid-section from which a chunk of tissue was removed, and from a synthetic transmural cardiac sample obtained using a rule-based helix angle variation (total turning 120 degrees). The reconstruction method 100 shows a significantly reduced angular error compared to other methods.

Figure 6:
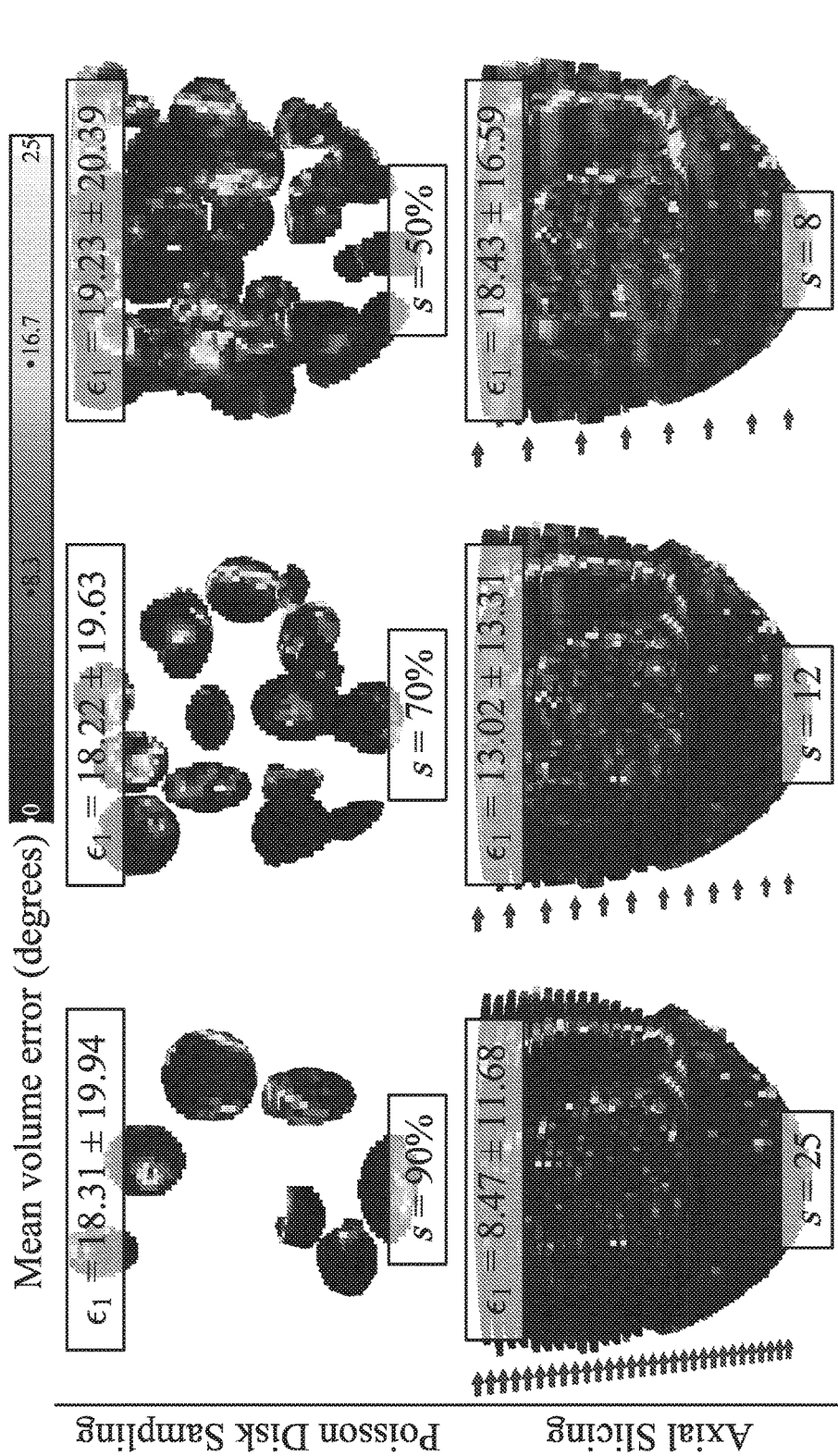
FIG. 6 illustrates mean angular reconstruction error $\epsilon_1$ between reconstructed fibers and the ground truth for increasingly Poisson-sparse volumes (top) using the proposed method, and reconstruction for increasingly interleaved volumes (bottom) in a long-axis cutout.

FIG. 6 shows Poisson and slicing error maps using the method 100 according to one embodiment. The error increases with the amount of damage, and is higher near boundaries.

Figure 7:
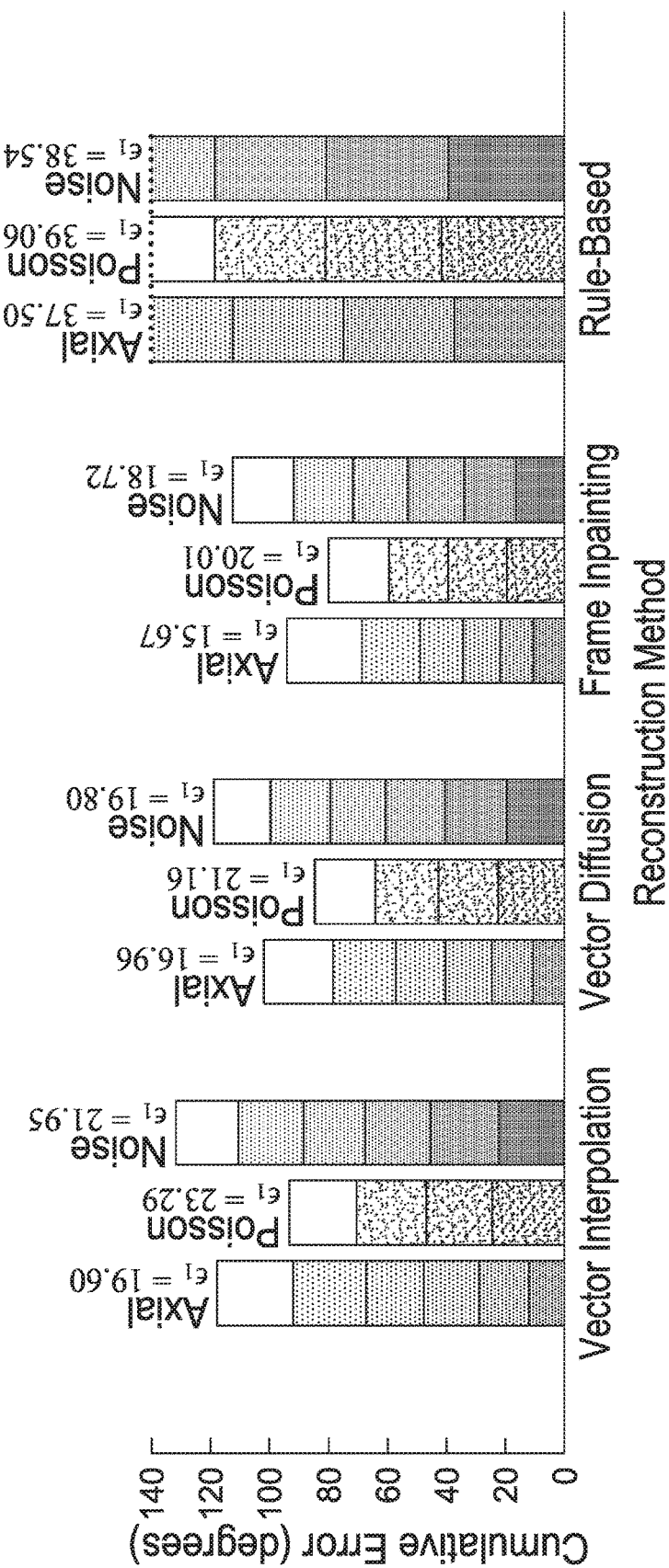
FIG. 7 illustrates mean volume error $\epsilon_1$ of reconstruction for various methods.

Referring to FIG. 7 there are compared mean reconstruction errors for the different methods. The method 100, referred to in FIG. 7 as "Frame Inpainting", outperforms the other methods in minimizing the reconstruction error in all corruption scenarios, and also shows comparable robustness to noise.

Figure 8:
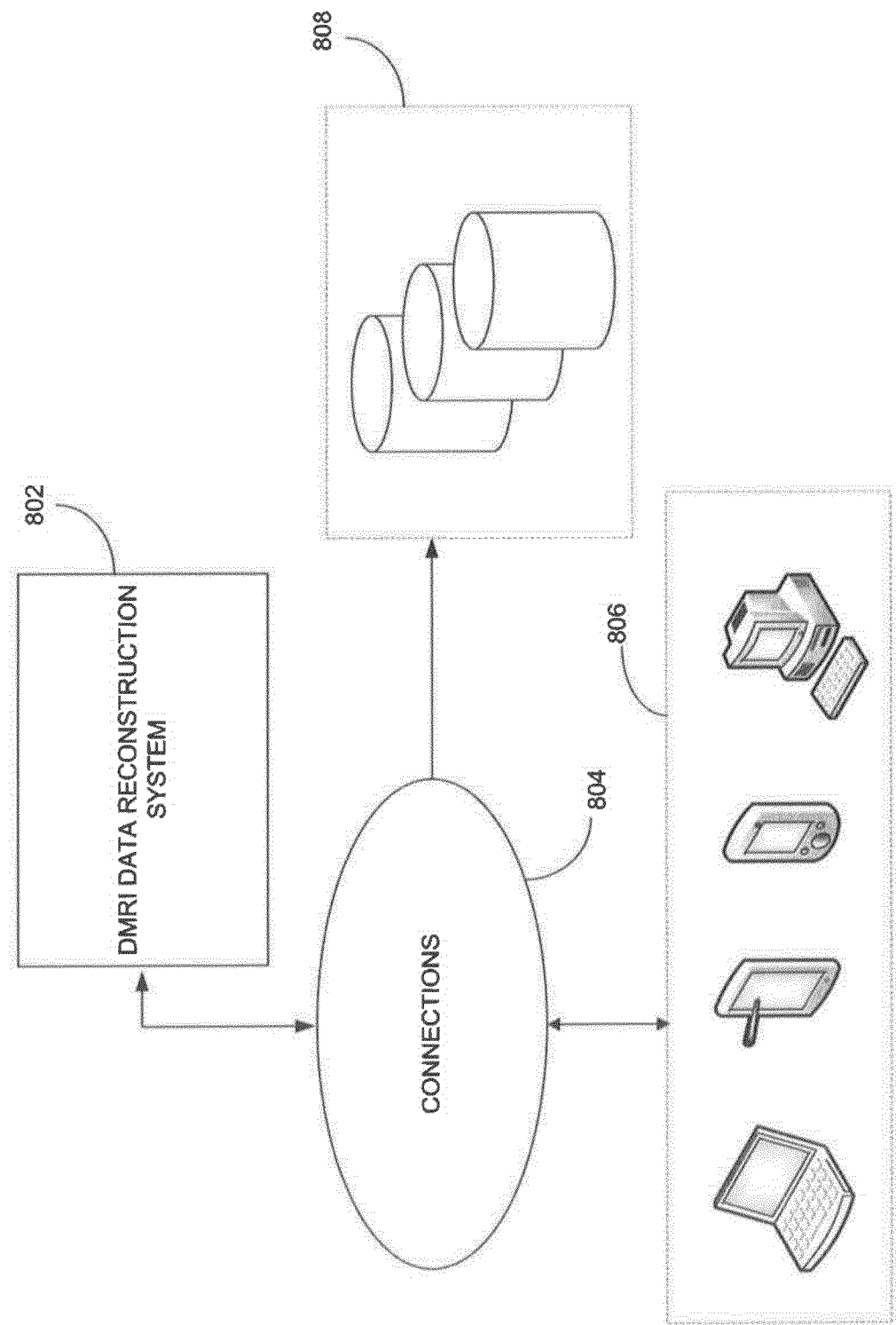
FIG. 8 illustrates an environment comprising a dMRI data reconstruction system.
Figure 9:
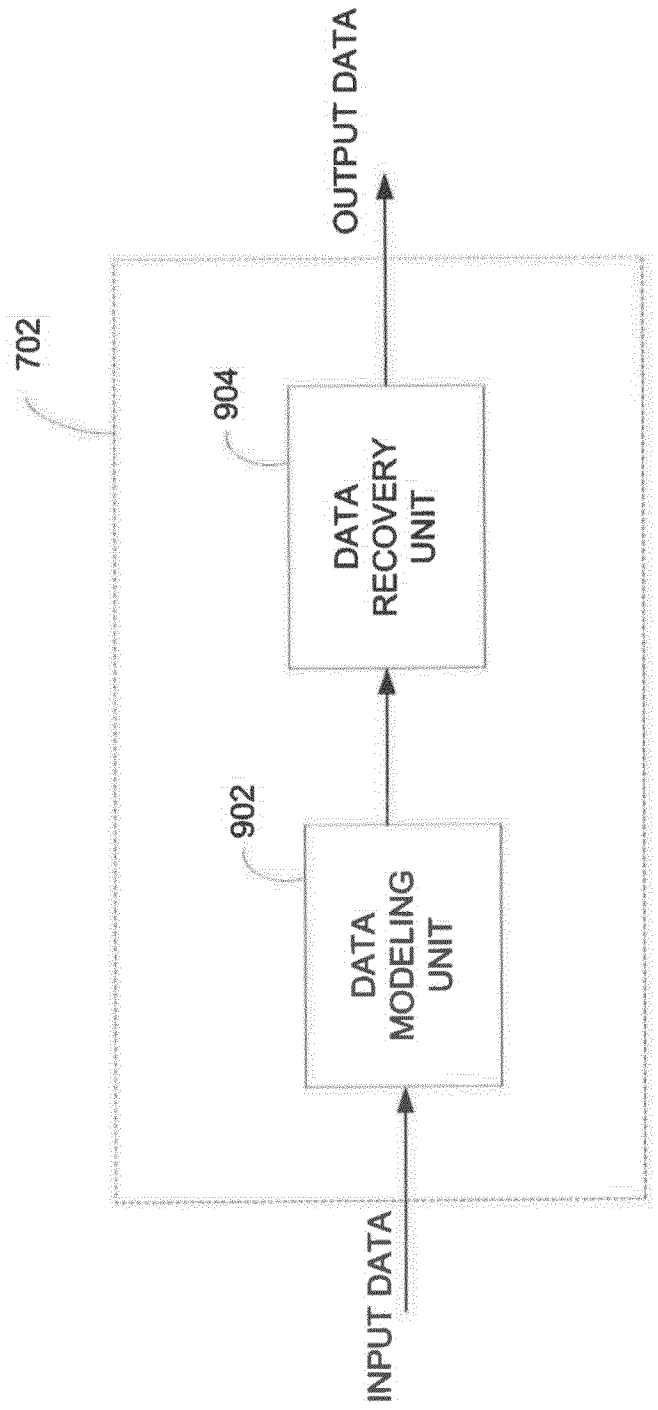
Figure 10:
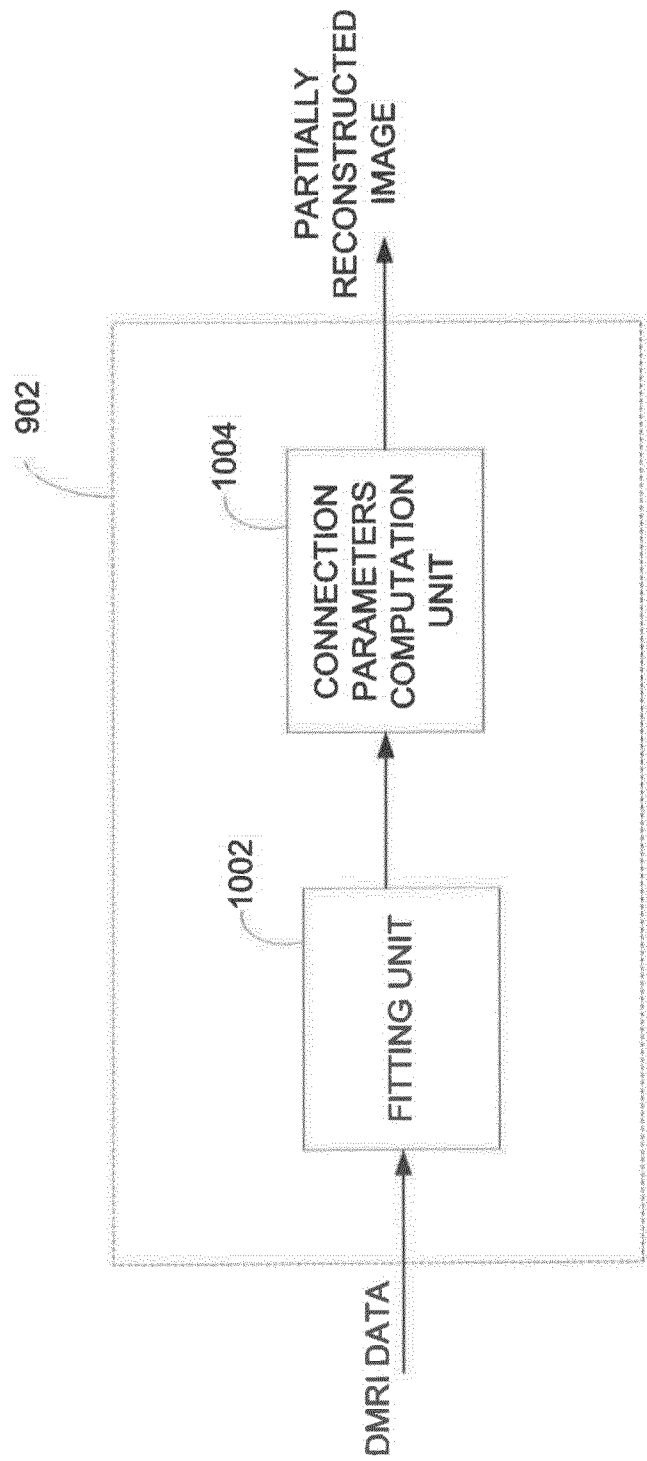
Figure 11:
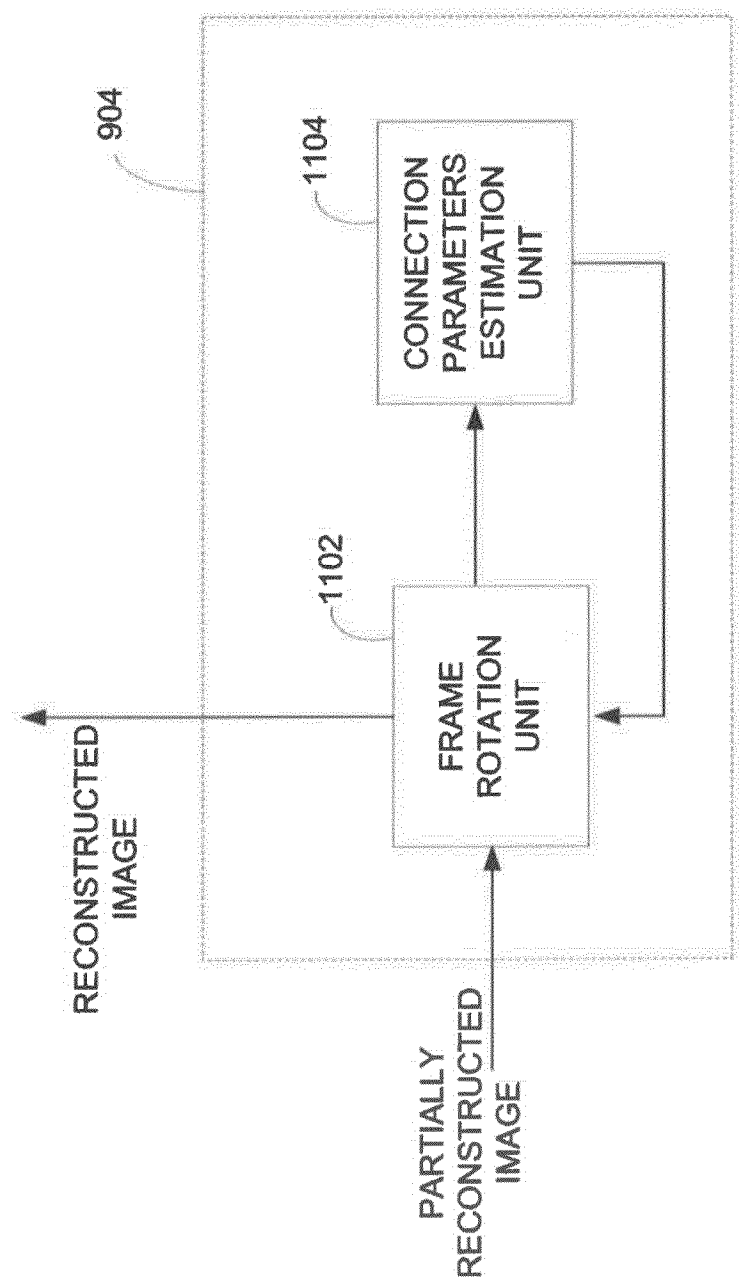
Figure 12:
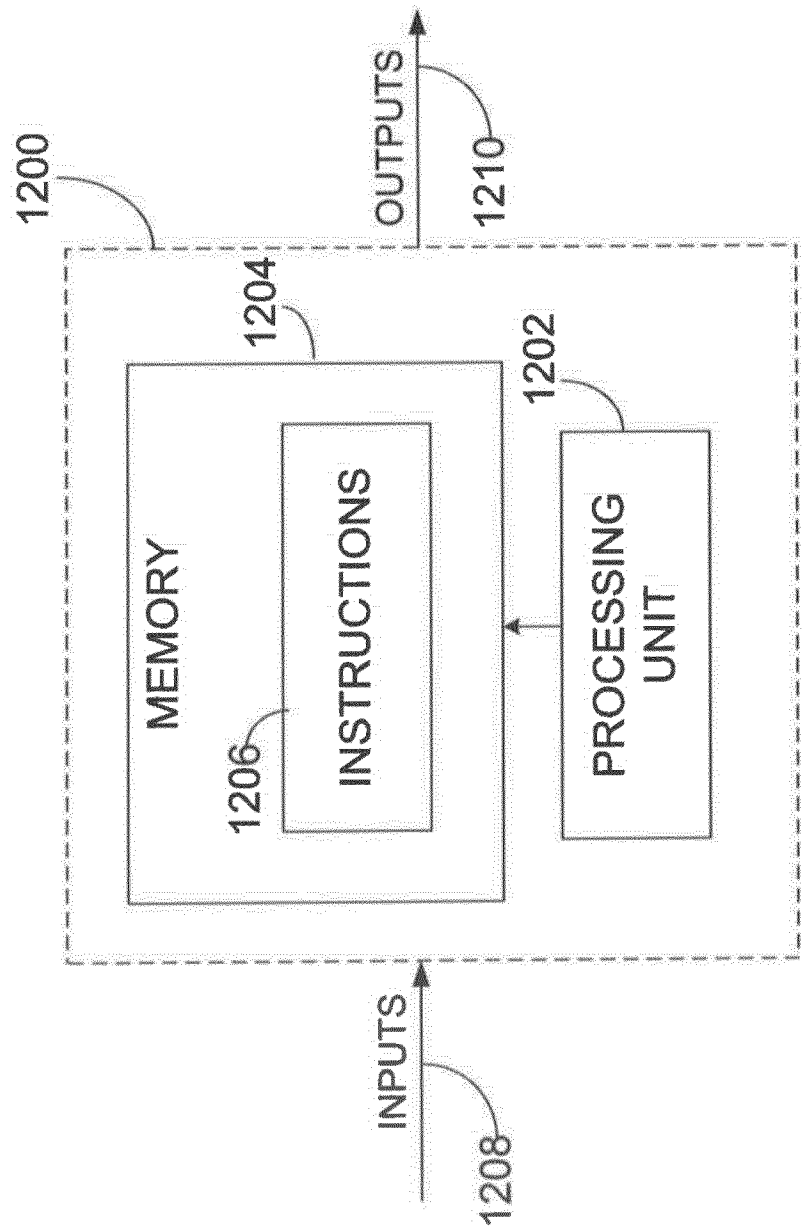

Turning to FIG. 8, there is illustrated a dMRI data reconstruction system 802. The system 802 may be implemented as a downloaded software application, a firmware application, or a combination thereof. The system 802 may be accessible remotely from any one of a plurality of devices 806 over connections 804. The devices 806 may comprise any device, such as a personal computer, a tablet, a smart phone, or the like, which is configured to communicate over the connections 804. In some embodiments, the system 802 may itself be provided directly on one of the devices 806, either as a downloaded software application, a firmware application, or a combination thereof.

The connections 804 may comprise wire-based technology, such as electrical wires or cables, and/or optical fibers. The connections 804 may also be wireless, such as RF, infrared, Wi-Fi, Bluetooth, and others. Connections 804 may therefore comprise a network, such as the Internet, the Public Switch Telephone Network (PSTN), a cellular network, or others known to those skilled in the art. Communication over the network may occur using any known communication protocols that enable devices within a computer network to exchange information. Examples of protocols are as follows: IP (Internet Protocol), UDP (User Datagram Protocol), TCP (Transmission Control Protocol), DHCP (Dynamic Host Configuration Protocol), HTTP (Hypertext Transfer Protocol), FTP (File Transfer Protocol), Telnet (Telnet Remote Protocol), SSH (Secure Shell Remote Protocol).

One or more databases 808 may be integrated directly into the system 802 or any one of the devices 806, or may be provided separately therefrom (as illustrated). In the case of a remote access to the databases 808, access may occur via connections 804 taking the form of any type of network, as indicated above. The various databases 808 described herein may be provided as collections of data or information organized for rapid search and retrieval by a computer. The databases 808 may be structured to facilitate storage, retrieval, modification, and deletion of data in conjunction with various data-processing operations. The databases 808 may be any organization of data on a data storage medium, such as one or more servers. The databases 808 illustratively have stored therein any one of datasets of dMRI data, computed local orthogonal frame directions (i, j, k), $c_{ijk}$ parameters, data defining boundaries of regions to reconstruct, reconstructed images, partially reconstructed images, and any other information used for the methods described herein.

Figure 9:
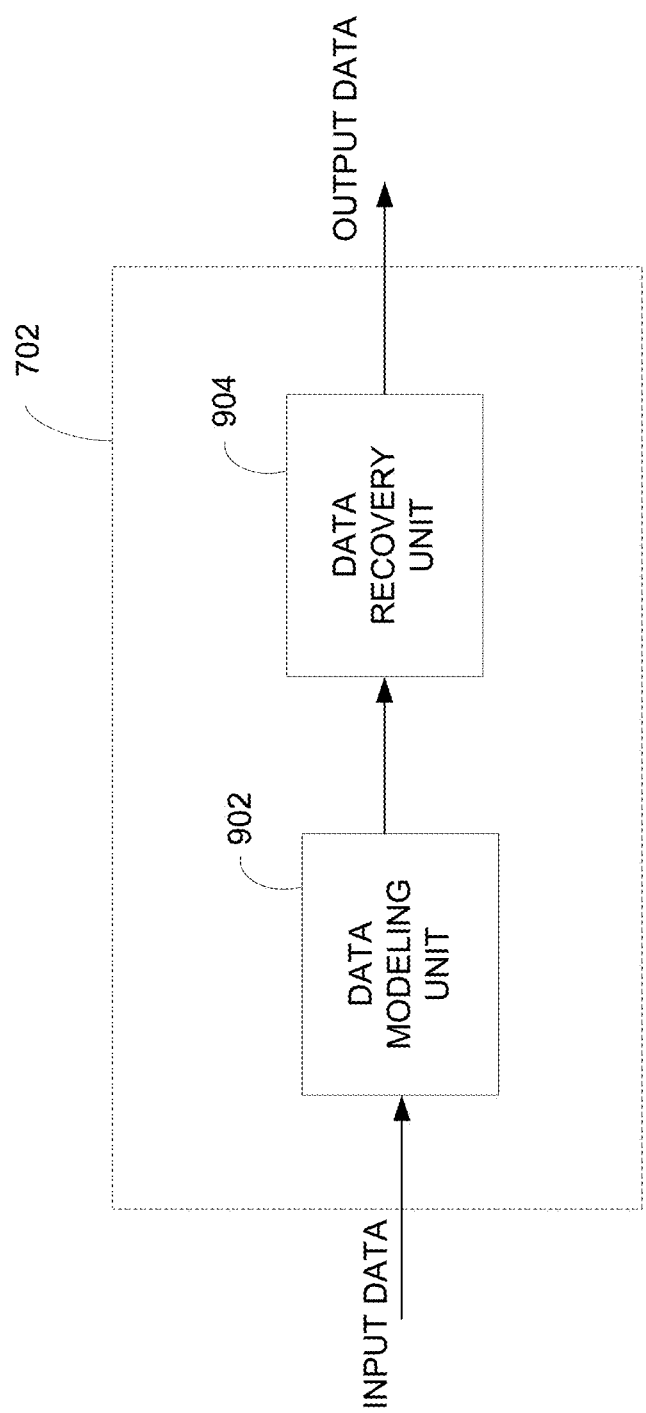
FIG. 9 is a block diagram of an exemplary embodiment of the dMRI data reconstruction system.

FIG. 9 is an example embodiment of the system 702. A data modeling unit 902 is configured to receive input data, such as dMRI data, and perform initial modeling steps of the data in accordance with the theory of moving frames, as per steps 102 and 104 of the method 100. Once the dMRI data are modeled, the data are transmitted to a data recovery unit 904, configured to perform step 106 of method 100. In some embodiments, the boundaries of regions to be reconstructed are defined by the data modeling unit 902 and provided to the data recovery unit 904. Alternatively, the data recovery unit 904 is configured to identify the regions to be reconstructed and define the boundaries.

Figure 10:
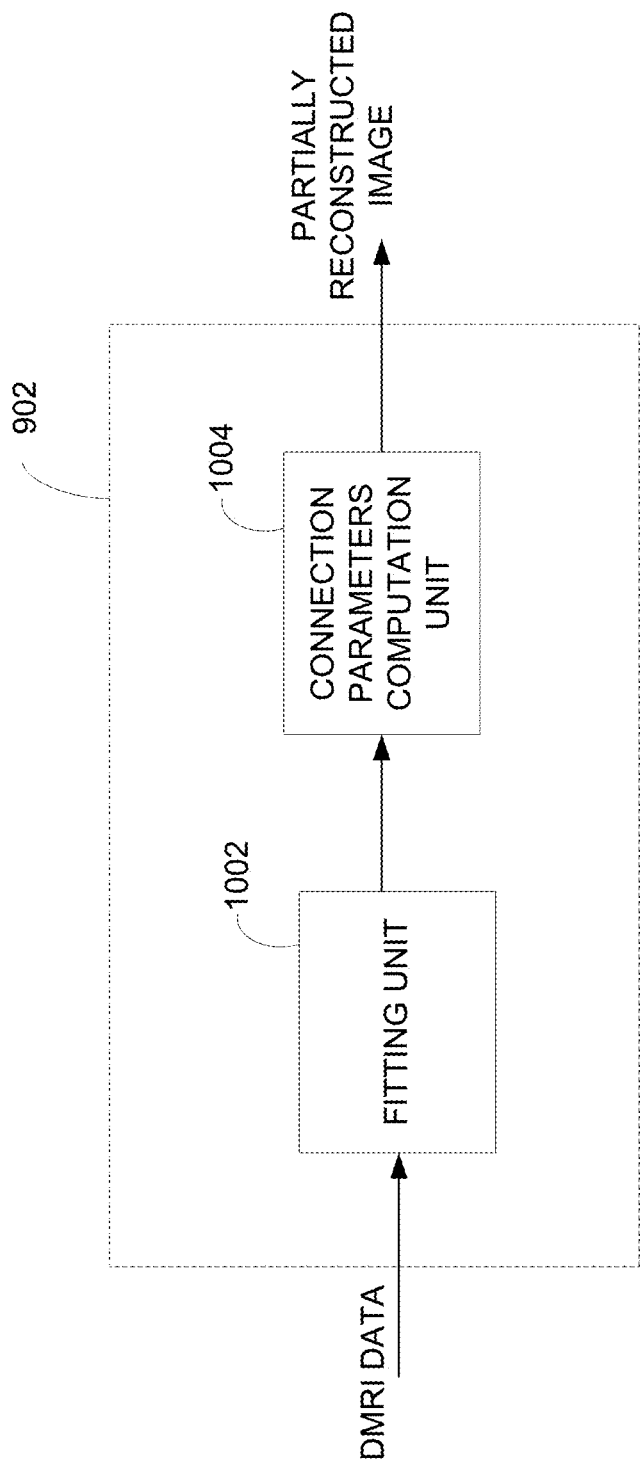
FIG. 10 is a block diagram of an exemplary embodiment of a data modeling unit.

FIG. 10 is an example embodiment of the data modeling unit 902, which illustratively comprises a fitting unit 1002 and a connection parameters computation unit 1004. The fitting unit 1002 may be configured to receive the dMRI data and compute the local orthogonal frame directions at each data point of the dMRI data. The connection parameters computation unit 1004 may be configured to compute the connection parameters $c_{ijk}$ in accordance with any one of the computation schemes described above, namely finite differentiation, energy minimization, and closed-form connections in linear space. Other computation schemes may also be used. In some embodiments, the closed-form connections computation scheme is used exclusively for computing the connection parameters $c_{ijk}$ of the known data, whereas a combination of computation schemes is used to estimate the connection parameters $c_{ijk}$ in the regions to be reconstructed. The connection parameters computation unit 1004 outputs a partially reconstructed image, with or without the boundaries of regions for reconstruction having been defined.

Figure 11:
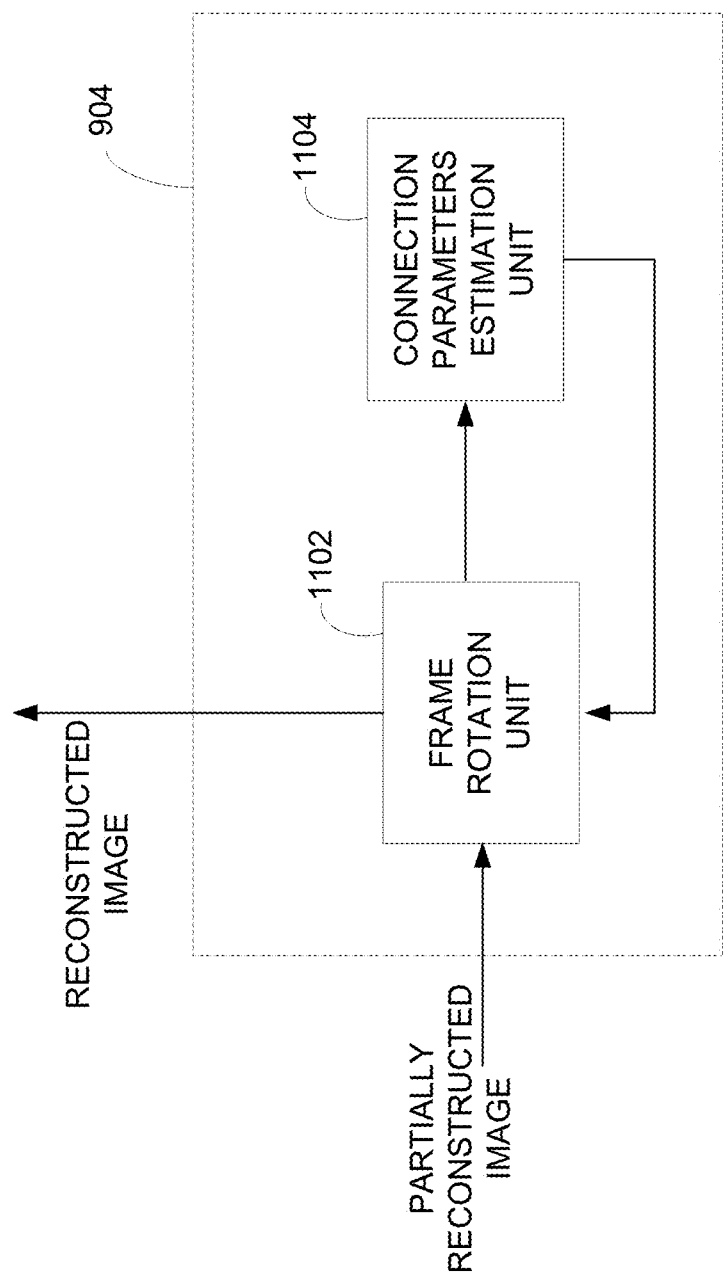
FIG. 11 is a block diagram of an exemplary embodiment of a data recovery unit.

FIG. 11 is an example embodiment of the data recovery unit 904. There is provided a frame rotation unit 1102 and a connection parameters estimation unit 1104. The frame rotation unit 1102 receives the partially reconstructed image, which may be represented as the computed frame directions (i, j, k) at each known data point and corresponding connection parameter $c_{ijk}$. Alternatively, the information input to the frame rotation unit 1102 is composed only of data points found at the boundaries of the regions to be reconstructed. Irrelevant data points, i.e. those not needed to perform the steps of rotation 402 and estimation 404, may be omitted. The connection parameters estimation unit 1104 is configured to receive the newly computed frame values after a rotation, and estimate connection parameters $c_{ijk}$ for the newly computed frame values. As indicated above, the process may be performed iteratively until each region has been fully reconstructed, or until a threshold has been reached regarding recovered data. A reconstructed image may be output.

Note that while illustrated separately, the connection parameters computation unit 1004 and the connection parameters estimation unit 1104 may be provided as a single unit that can perform both computation based on obtained dMRI data and estimation based on rotated local orthogonal frames. Similarly, the two units 1004 and 1104 may share certain resources. Other units may also be combined or separated as desired to suit the targeted functions.

Figure 12:
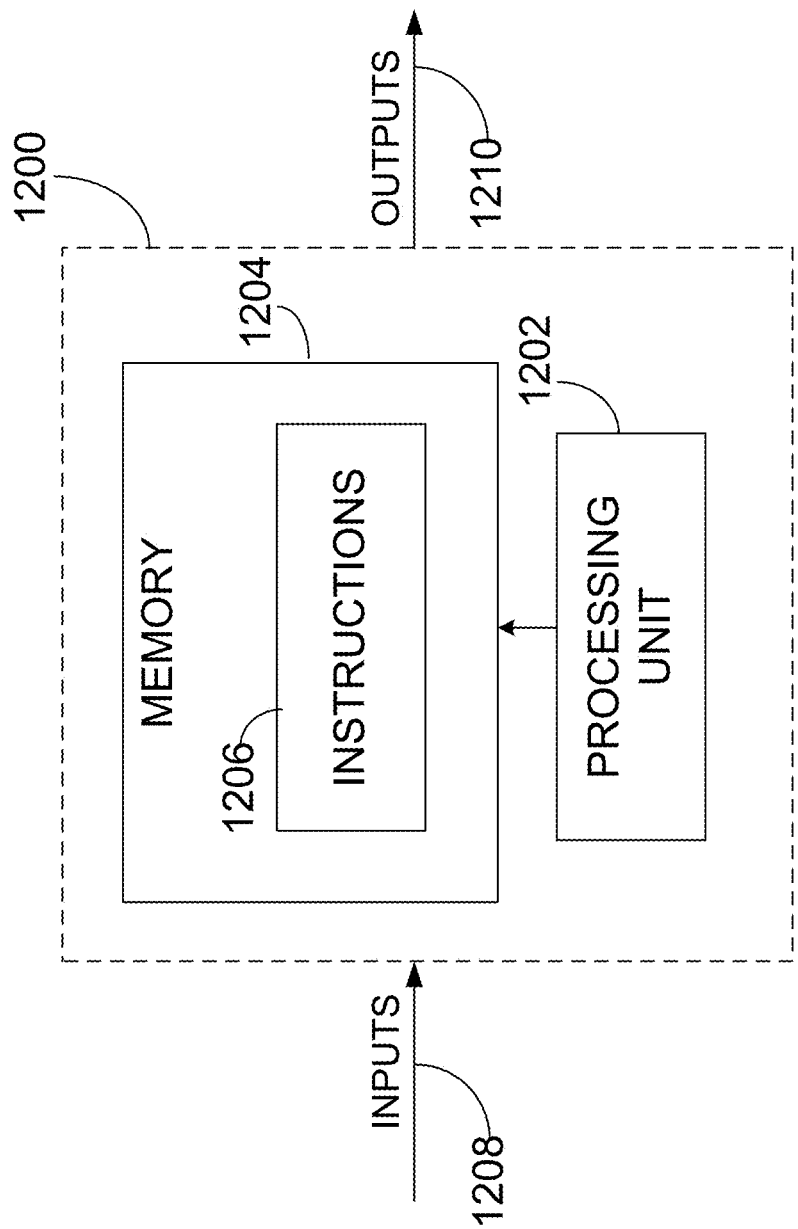
FIG. 12 is a block diagram of an exemplary hardware and software implementation of the method of FIG. 1.
Figure 1:
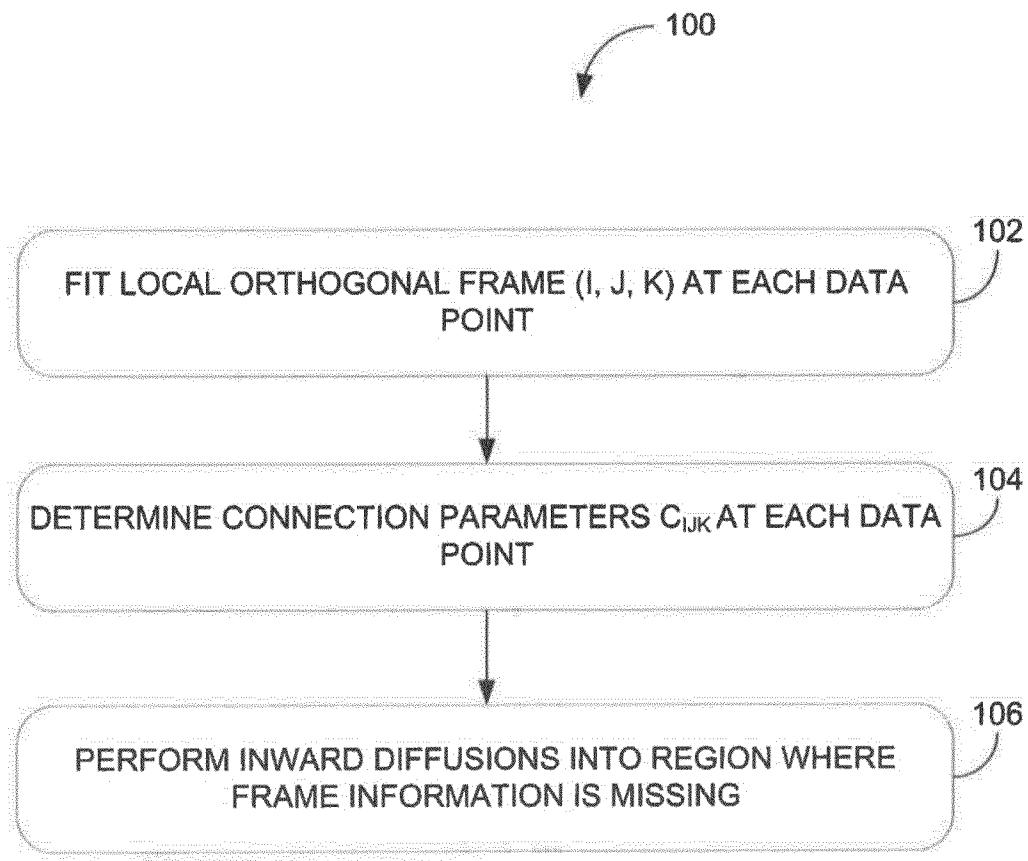
Figure 2A:
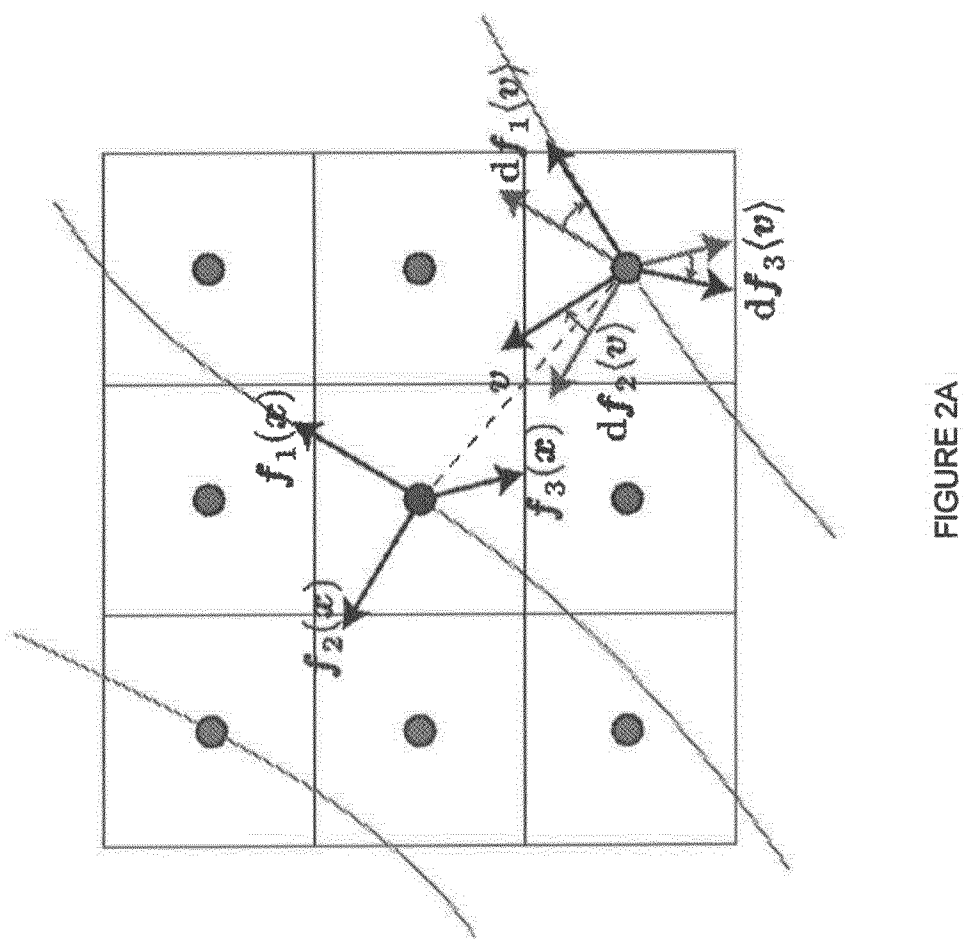
Figure 2B:
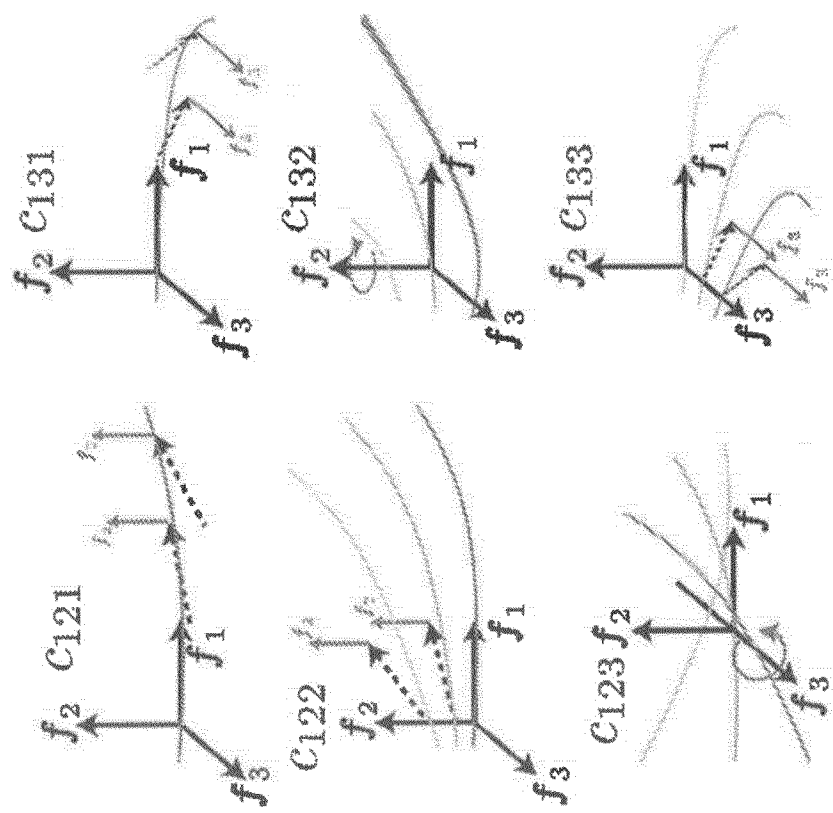
Figure 3:
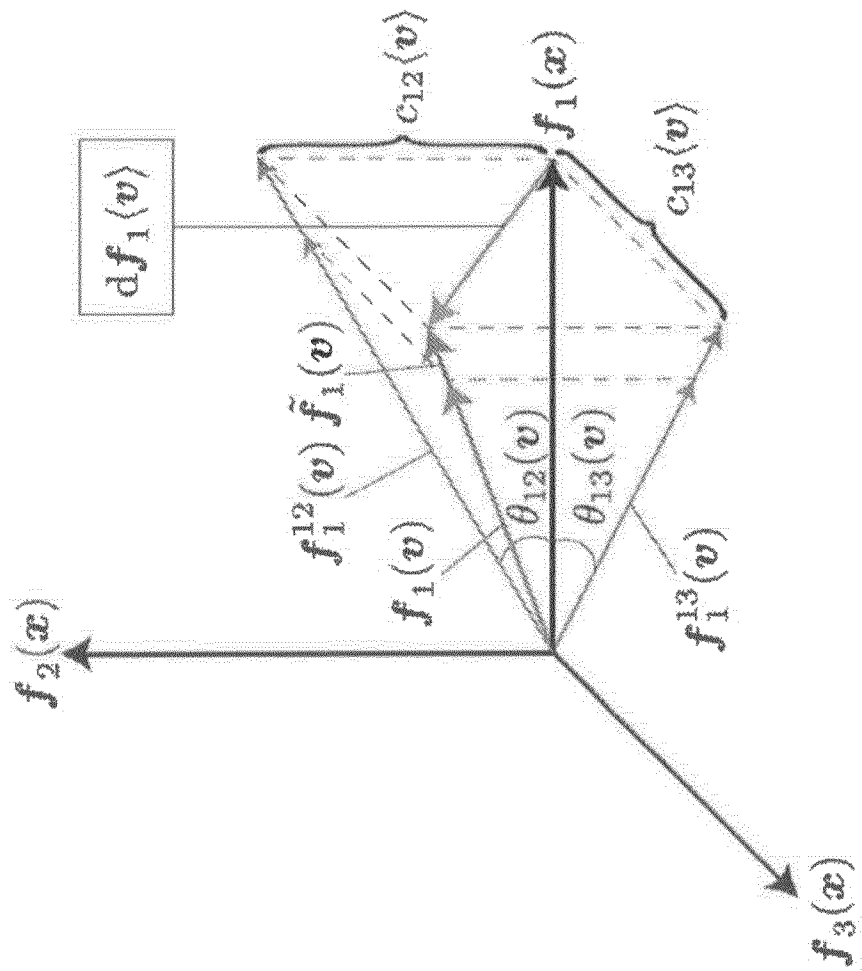
Figure 4:
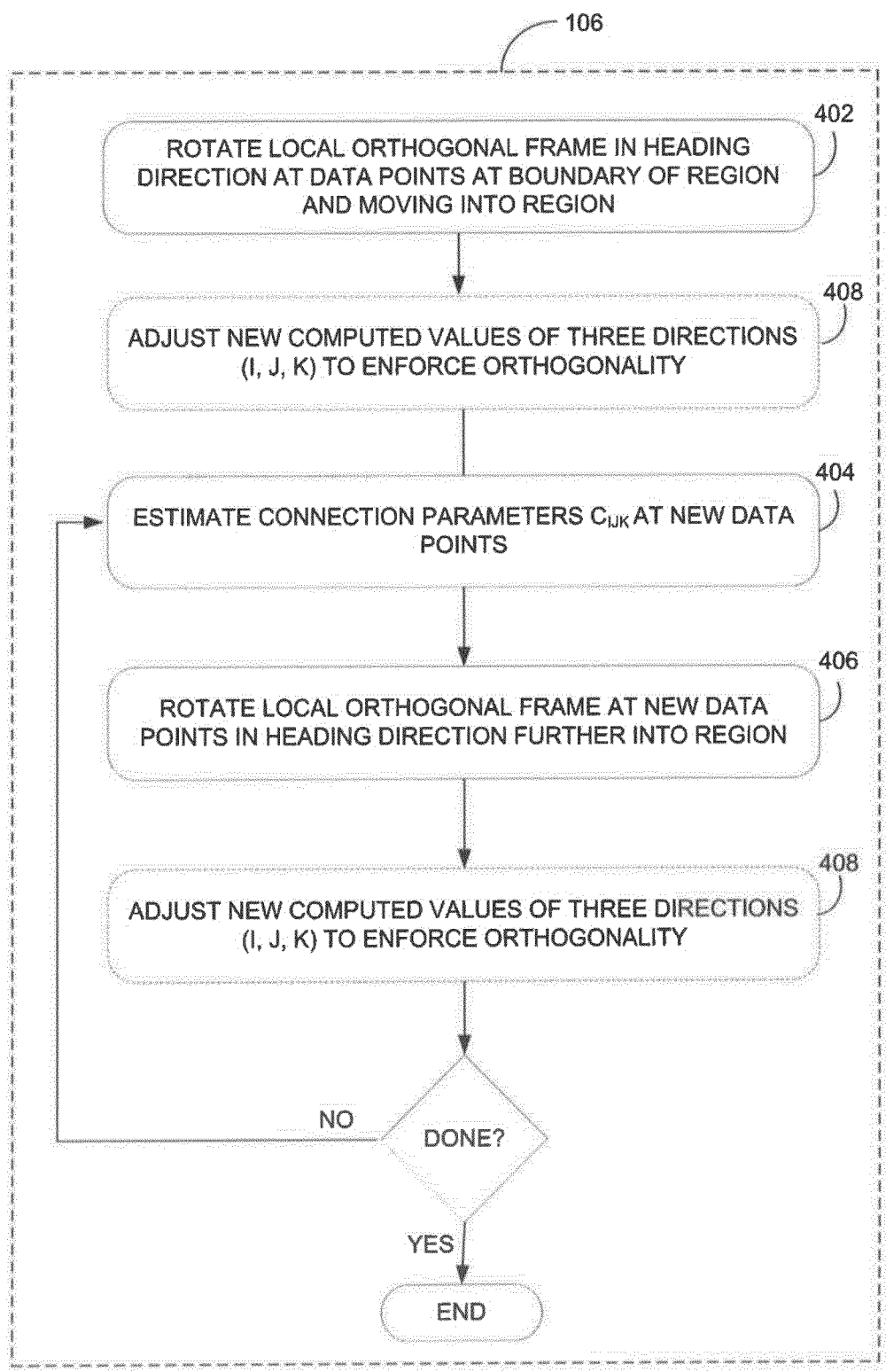
Figure 5:
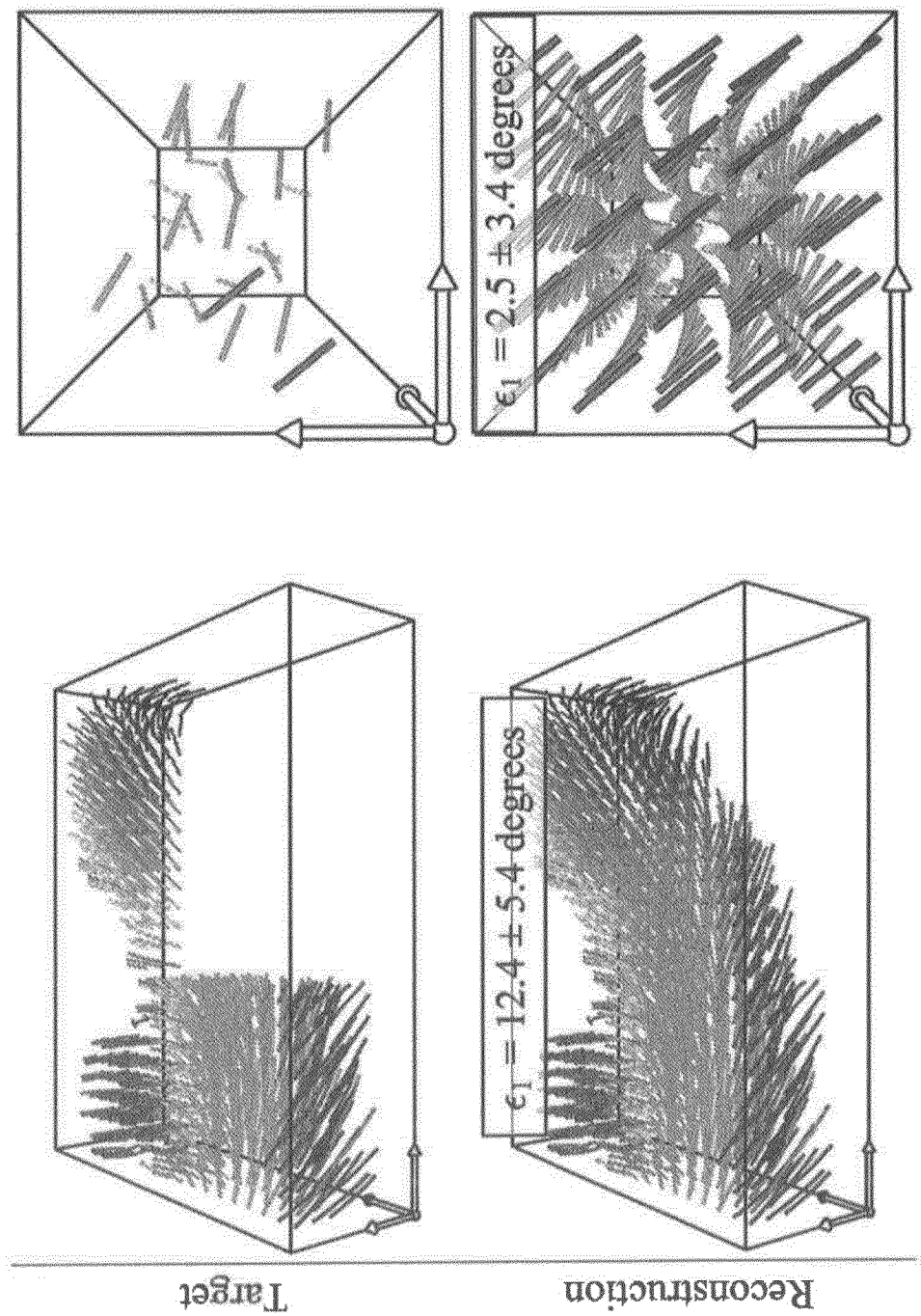
Figure 6:
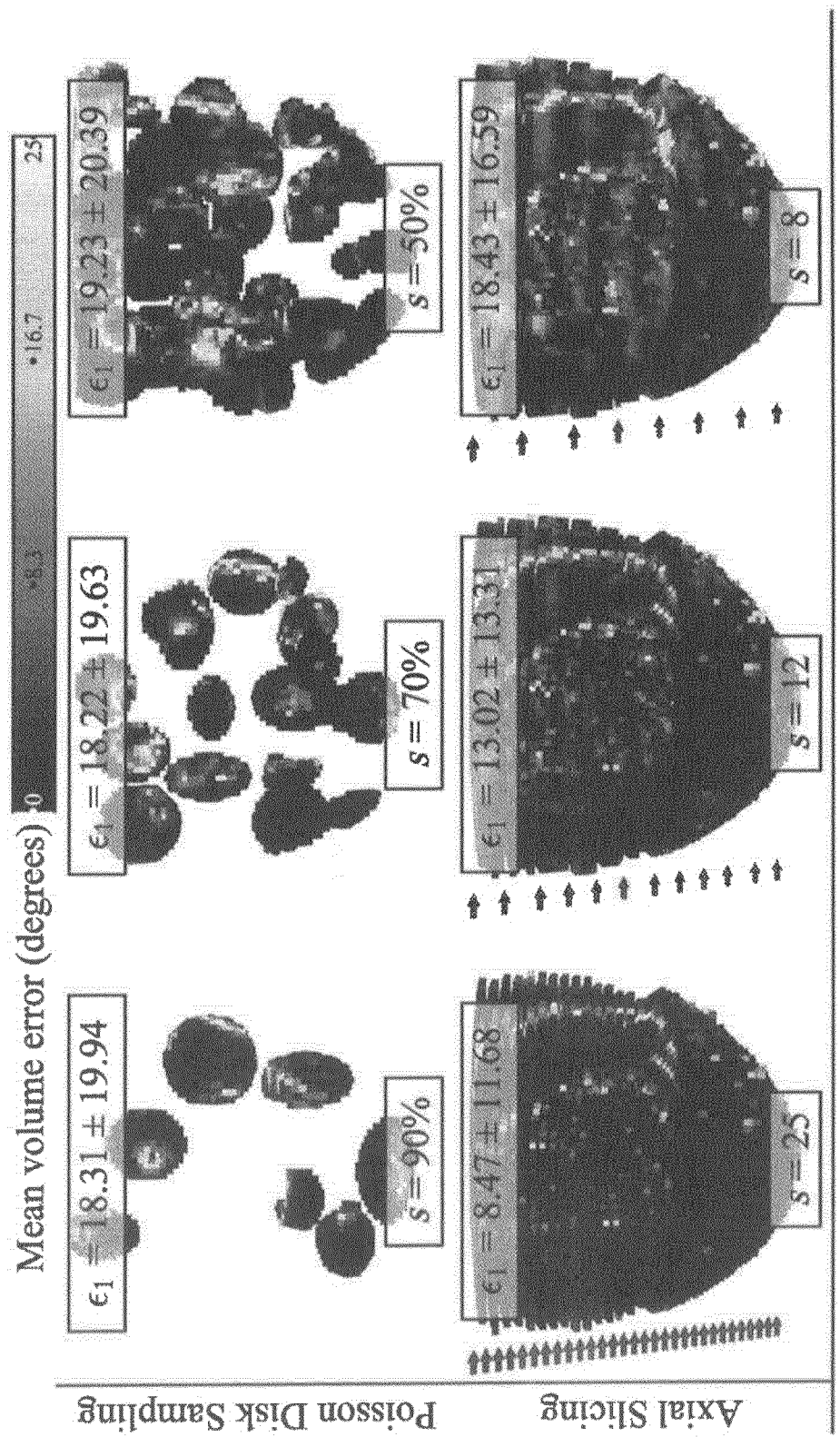
Figure 7:
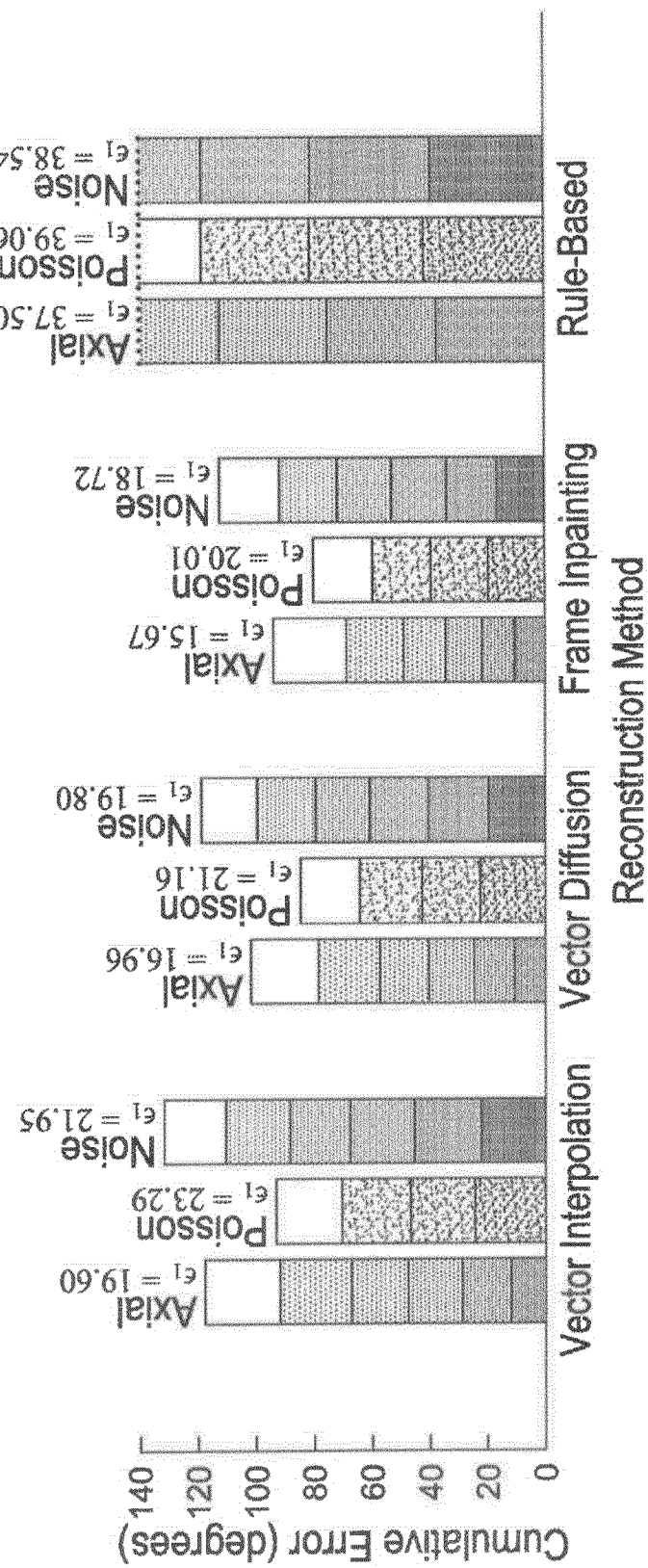

FIG. 12 shows a schematic representation of an example implementation of the method 100 as a combination of software and hardware components. A computing device 1200 is illustrated with one or more processing units (referred to as "the processing unit 1202") and one or more computer-readable memories (referred to as "the memory 1204") having stored thereon program instructions 1206 configured to cause the processing unit 1202 to generate one or more outputs based on one or more inputs. The inputs may comprise the dMRI data and any additional information needed to perform the method 100. The outputs may comprise partially reconstructed images, fully reconstructed images, and any other information resulting from performing any step of the method 100.

The processing unit 1202 may comprise any suitable devices configured to cause a series of steps to be performed so as to implement the computer-implemented method 100 such that instructions 1206, when executed by a computing device 1200 or other programmable apparatus, may cause the functions/acts/steps specified in the methods described herein to be executed. The processing unit 1202 may comprise, for example, any type of general-purpose microprocessor or microcontroller, a digital signal processing (DSP) processor, a central processing unit (CPU), an integrated circuit, a field programmable gate array (FPGA), a reconfigurable processor, other suitably programmed or programmable logic circuits, or any combination thereof.

The memory 1204 may comprise any suitable known or other machine-readable storage medium. The memory 1204 may comprise non-transitory computer readable storage medium such as, for example, but not limited to, an electronic, magnetic, optical, electromagnetic, infrared, or semiconductor system, apparatus, or device, or any suitable combination of the foregoing. The memory 1204 may include a suitable combination of any type of computer memory that is located either internally or externally to device such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. Memory may comprise any storage means (e.g., devices) suitable for retrievably storing machine-readable instructions executable by processing unit.

Each computer program described herein may be implemented in a high level procedural or object-oriented programming or scripting language, or a combination thereof, to communicate with a computer system. Alternatively, the programs may be implemented in assembly or machine language. The language may be a compiled or interpreted language. Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

While illustrated in block diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. The structure illustrated is thus provided for efficiency of teaching the present embodiment.

The above description is meant to be exemplary only, and one skilled in the relevant arts will recognize that changes may be made to the embodiments described without departing from the scope of the invention disclosed. For example, the blocks and/or operations in the flowcharts and drawings described herein are for purposes of example only. There may be many variations to these blocks and/or operations without departing from the teachings of the present disclosure. For instance, the blocks may be performed in a differing order, or blocks may be added, deleted, or modified.

The present disclosure may be embodied in other specific forms without departing from the subject matter of the claims. Also, one skilled in the relevant arts will appreciate that while the systems, methods and computer readable mediums disclosed and shown herein may comprise a specific number of elements/components, the systems, methods and computer readable mediums may be modified to include additional or fewer of such elements/components. The present disclosure is also intended to cover and embrace all suitable changes in technology. Modifications which fall within the scope of the present disclosure will be apparent to those skilled in the art, in light of a review of this disclosure, and such modifications are intended to fall within the appended claims.

The invention claimed is:

1. A method for recovering missing information in diffusion magnetic resonance imaging (dMRI) data, the method comprising:
    fitting, at each data point of the dMRI data, a local orthogonal frame expressed as (i, j, k) to represent three directions;
    determining connection parameters $c_{ijk}$ at each data point to represent a rotation of the local orthogonal frame in a spatial neighborhood of the data point in accordance with the dMRI data; and
    performing inward diffusions into a region where frame information is missing by:
        rotating the local orthogonal frame in a heading direction at data points starting along a boundary of the region and moving into the region; and
        estimating connection parameters $c_{ijk}$ at each new data point obtained by a preceding rotation of the local orthogonal frame, for application to a subsequent rotation of the local orthogonal frame at the new data point.

2. The method of claim 1, wherein rotating the local orthogonal frame comprises computing new values for the three directions (i, j, k) independently.

3. The method of claim 2, further comprising adjusting the computed new values to enforce orthogonality of the three directions (i, j, k).

4. The method of claim 1, wherein determining connection parameters $c_{ijk}$ at each data point of the dMRI data comprises computing closed-form connections in linear space.

5. The method of claim 1, wherein estimating connection parameters $c_{ijk}$ at each new data point comprises selecting a computation scheme from a group comprising finite differentiation, energy minimization, and closed-form connections in linear space.

6. The method of claim 5, wherein selecting the computation scheme comprises selecting as a function of local parameters of each one of the new data points.

7. The method of claim 1, wherein performing inward diffusions into a region of missing information comprises rotating the local orthogonal frame and estimating the connection parameters $c_{ijk}$ for a plurality of layers of the region in an iterative fashion.

8. The method of claim 7, wherein each one of the plurality of layers has a thickness corresponding to one voxel.

9. The method of claim 1, wherein fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

10. The method of claim 9, wherein the region is a volumetric region or a distributed region, and wherein missing information is recovered for a plurality of regions in the heart wall in order to reconstruct a three-dimensional image of fiber orientations.

11. A system for recovering missing information in diffusion magnetic resonance imaging (dMRI) data, the system comprising:
a processing unit; and
a non-transitory memory communicatively coupled to the processing unit and comprising computer-readable program instructions executable by the processing unit for:
fitting, at each data point of the dMRI data, a local orthogonal frame expressed as (i, j, k) to represent three directions;
determining connection parameters $c_{ijk}$ at each data point to represent a rotation of the local orthogonal frame in a spatial neighborhood of the data point in accordance with the dMRI data; and
performing inward diffusions into a region where frame information is missing by:
rotating the local orthogonal frame in a heading direction at data points starting along a boundary of the region and moving into the region; and
estimating connection parameters $c_{ijk}$ at each new data point obtained by a preceding rotation of the local orthogonal frame, for application to a subsequent rotation of the local orthogonal frame at the new data point.

12. The system of claim 11, wherein rotating the local orthogonal frame comprises computing new values for the three directions (i, j, k) independently.

13. The system of claim 12, wherein the program instructions are further executable for adjusting the computed new values to enforce orthogonality of the three directions (i, j, k).

14. The system of claim 11, wherein determining connection parameters $c_{ijk}$ at each data point of the dMRI data comprises computing closed-form connections in linear space.

15. The system of claim 11, wherein estimating connection parameters $c_{ijk}$ at each new data point comprises selecting a computation scheme from a group comprising finite differentiation, energy minimization, and closed-form connections in linear space.

16. The system of claim 15, wherein selecting the computation scheme comprises selecting as a function of local parameters of each one of the new data points.

17. The system of claim 11, wherein performing inward diffusions into a region of missing information comprises rotating the local orthogonal frame and estimating the connection parameters $c_{ijk}$ for a plurality of layers of the region in an iterative fashion.

18. The system of claim 17, wherein each one of the plurality of layers has a thickness corresponding to one voxel.

19. The system of claim 11, wherein fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

20. The system of claim 19, wherein the region is a volumetric region or a distributed region, and wherein missing information is recovered for a plurality of regions in the heart wall in order to reconstruct a three-dimensional image of fiber orientations.

* * * * *

UNITED STATES PATENT AND TRADEMARK OFFICE
CERTIFICATE OF CORRECTION

| | |
|---|---|
| PATENT NO. | : 10,109,081 B2 |
| APPLICATION NO. | : 15/154404 |
| DATED | : October 23, 2018 |
| INVENTOR(S) | : Siddiqi et al. |

Page 1 of 25

It is certified that error appears in the above-identified patent and that said Letters Patent is hereby corrected as shown below:

Please delete Patent No. 10,109,081 B2 in its entirety and insert Patent No. 10,109,081 B2 in its entirety as shown on the attached pages.

Signed and Sealed this
Ninth Day of July, 2019

Andrei Iancu
*Director of the United States Patent and Trademark Office*

(12) United States Patent
Siddiqi et al.

(10) Patent No.: US 10,109,081 B2
(45) Date of Patent: Oct. 23, 2018

(54) RECOVERY OF MISSING INFORMATION IN DIFFUSION MAGNETIC RESONANCE IMAGING DATA

(71) Applicant: THE ROYAL INSTITUTION FOR THE ADVANCEMENT OF LEARNING/MCGILL UNIVERSITY, Montreal (CA)

(72) Inventors: Kaleem Siddiqi, Westmount (CA); Emmanuel Piuze-Phaneuf, Montreal (CA); Jon Sporring, Allerod (DK)

(73) Assignee: THE ROYAL INSTITUTION FOR THE ADVANCEMENT OF LEARNING / MGGILL UNIVERSITY, Montreal (CA)

(*) Notice: Subject to any disclaimer, the term of this patent is extended or adjusted under 35 U.S.C. 154(b) by 0 days.

(21) Appl. No.: 15/154,404

(22) Filed: May 13, 2016

(65) Prior Publication Data
US 2016/0335786 A1    Nov. 17, 2016

Related U.S. Application Data

(60) Provisional application No. 62/160,694, filed on May 13, 2015.

(51) Int. Cl.
| | |
|---|---|
| G06K 9/00 | (2006.01) |
| G06T 11/00 | (2006.01) |
| G01R 33/56 | (2006.01) |
| G06T 5/00 | (2006.01) |
| G01R 33/563 | (2006.01) |

(52) U.S. Cl.
CPC ........ *G06T 11/008* (2013.01); *G01R 33/5608* (2013.01); *G06T 5/005* (2013.01); *G01R 33/56341* (2013.01); *G06T 2207/10092* (2013.01)

(58) Field of Classification Search
USPC .................................................. 382/128–134
See application file for complete search history.

(56) References Cited

U.S. PATENT DOCUMENTS

2007/0274579 A1* 11/2007 Cai .................... A61B 5/02007
382/131
2010/0278405 A1* 11/2010 Kakadiaris .......... G06F 19/3431
382/131

OTHER PUBLICATIONS

Streeter, D.D.: Gross morphology and fiber geometry of the heart. In: Berne, R.M., Sperelakis, N. (eds.) Handbook of Physiology, Section 2. The Heart, pp. 61-112. Williams and Wilkins, New York (1979).

(Continued)

*Primary Examiner* — Alex Liew
(74) *Attorney, Agent, or Firm* — Norton Rose Fulbright Canada LLP

(57) ABSTRACT

There is described herein a method for recovering missing information in diffusion magnetic resonance imaging (dMRI) data. The data are modeled according to the theory of moving frames and regions where frame information is missing are reconstructed by performing diffusions into the regions. Local orthogonal frames computed along the boundary of the regions are rotated into the regions. Connection parameters are estimated at each new data point obtained by a preceding rotation, for application to a subsequent rotation.

20 Claims, 13 Drawing Sheets

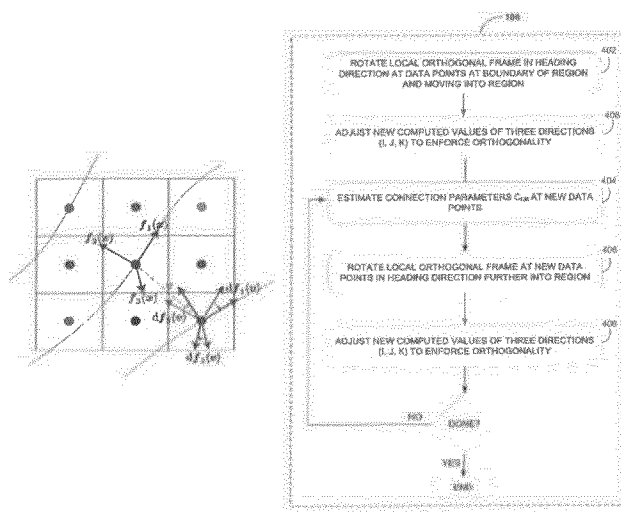

(56) References Cited

OTHER PUBLICATIONS

Peskin, C.S.: Mathematical aspects of heart physiology. Technical report, Courant Institute of Math. Sciences, New York University, New York, NY, USA (1975).
Horowitz, A., Perl, M., Sideman, S.: Geodesics as a mechanically optimal fiber geometry for the left ventricle. Basic. Res. Cardiol. 88(suppl. 2), 67-74 (1993).
Geerts, L., Bovendeerd, P., Nicolay, K., Arts, T.: Characterization of the normal cardiac myofiber field in goat measured with mr-diffusion tensor imaging. Am. J. Physiol.: Heart and Circ. Physiol. 283, H139-H145 (2002).
Beg, M.F., Helm, P.A., McVeigh, E.M., Miller, M.I.,Winslow, R.L.: Computational cardiac anatomy using mri. Magn. Reson. Med. 52,1167-1174 (2004).
Chen, J., Liu, W., Zhang, H., Lacy, L., Yang, X., Song, S.K., Wickline, W.A., Yu, X.: Regional ventricular wall thickening reflects changes in cardiac fiber and sheet structure during contraction: quantification with diffusion tensor mri, Am. J. Physiol.: Heart and Circ. Physiol. 289, H1898-H1907 (2005).
Streeter, D., Bassett, D.: An engineering analysis of myocardial fiber orientation in pig's left ventricle in systole. The Anatomical Record 155(4), 503-511 (2005).
LeGrice, I.J., Smaill, B.H., Chai, L.Z., Edgar, S.G., Gavin, J.B., Hunter, P.J.: Ventricular myocyte arrangement and connective tissue architecture in the dog. Am. J. Physiol.: Heart and Circ. Physiol. 269 (1995).
Rohmer, D., Sitek, A., Gullberg, G.T.: Reconstruction and visualization of fiber and laminar structure in the normal human heart from ex vivo diffusion tensor magnetic resonance imaging (dtmri) data. Invest. Radiol. 42(11), 777-789 (2007).
Lombaert, H., Peyrat, J.-M., Croisille, P., Rapacchi, S., Fanton, L., Clarysse, P., Delingette, H., Ayache, N.: Statistical analysis of the human cardiac fiber architecture from DT-MRI, In: Metaxas, D.N., Axel, L. (eds.) FIMH 2011. LNCS. vol. 6666, pp. 171-179. Springer, Heidelberg (2011).
Ben-Shahar, O., Zucker, S.W.: The perceptual organization of texture flow: A contextual inference approach. IEEE TPAMI 25(4) (2003).
Savadjiev, P., Strijkers, G.J., Bakermans, A.J., Piuze, E., Zucker, S.W., Siddiqi, K.: Heart wall myofibers are arranged in minimal surfaces to optimize organ function. Proc. Natl. Acad. Sci. USA 109(24), 9248-9253 (2012).
Koenderink, J.: Solid shape. vol. 2. Cambridge Univ. Press (1990).
Bayer, J., Blake, R., Plank, G., Trayanova, N.: A novel rule-based algorithm for assigning myocardial fiber orientation to computational heart models. Annals of biomedical engineering (40) 10), 2243-2254 (2012).
P. J. Olver and J. Pohjanpelto, "Maurer—Cartan forms and the structure of lie pseudo-groups," Selecta. Math., vol. 11, No. 1, pp. 99-126, 2005.
O. Faugeras, Cartan's Moving Frame Method and Its Application to the Geometry and Evolution of Curves in the Euclidean, Affine and Projective Planes. New York, NY, USA: Springer, 1994.
T. Flash and A. A. Handzel, "Affine differential geometry analysis of human arm movements," Biol. Cybern., vol. 96, No. 6, pp. 577-601, 2007.
M. Boutin and P.-L. Bazin, "Structure from motion: A new look from the point of view of invariant theory," SIAM J. Appl. Math., vol. 64, No. 4, pp. 1156-1174, 2004.
O. Ben-Shahar and S. W. Zucker, "The perceptual organization of texture flow: A contextual inference approach," IEEE Trans. Pattern Anal. Mach. Intell., vol. 25, No. 4, pp. 401-417, Apr. 2003.
P. Savadjiev, G. L. Kindlmann, S. Bouix, M. E. Shenton, and C.-F. Westin, "Local white matter geometry from diffusion tensor gradients," NeuroImage. vol. 49, No. 4, pp. 3175-3186, 2010.
E. Calabi, P. J. Olver, C. Shakiban, A. Tannenbaum, and S. Haker. "Differential and numerically invariant signature curves applied to object recognition," Int. J. Comput. Vision. vol. 26, No. 2, pp. 107-135, 1998.

P. J. Olver, "Joint invariant signatures," Found. Comput. Math., vol. 1, No. 1, pp. 3-68, 2001.
E. Piuze, J. Sporring, and K. Siddiqi, "Moving frames for heart fiber geometry," Inform. Process. Med. Imaging, vol. 23, pp. 524-535, 2013.
E. Piuze, H. Lombaert, J. Sporring, G. J. Strijkers, A. J. Backermans, and K. Siddiqi, "Atlases of cardiac fiber differential geometry," in Proc. 7th Int. Conf. Functional Imag. Modeling Heart, 2013, pp. 442-449.
P. Savadjiev, G. J. Strijkers, A. J. Bakermans, E. Piuze, S. W. Zucker, and K. Siddiqi, "Heart wall myofibers are arranged in minimal surfaces to optimize organ function," Proc. Nat. Acad. Sci. USA., vol. 109, No. 24, pp. 9248-9253, 2012.
P. Savadjiev, S. W. Zucker, and K. Siddiqi, "On the differential geometry of 3d flow patterns: Generalized helicoids and diffusion mri analysis," in Proc. Int. Conf. Comput. Vis., 2007, pp. 1-8.
H. Flanders, Differential Forms with Applications to the Physical Sciences. Mineloa, New York, USA: Dover, 2012.
W. Press, S. Teukolsky, W. Vetterling, and B. Flannery, Numerical Recipes: The Art of Scientific Computing, 3rd ed, Cambridge, U.K.: Cambridge Univ. Press, 2007.
M. J. Powell, "The BOBYQA algorithm for bound constrained optimization without derivatives," Cambridge NA Rep. NA2009/ 06, Univ. Cambridge, Cambridge, U.K., 2009.
T. Needham, Visual Complex Analysis. Oxford, U.K.: Clarendon, 1998.
E. Piuze, P. G. Kry, and K. Siddiqi, "Generalized helicoids for modeling hair geometry," Comput. Graph. Forum, vol. 30, No. 2, pp. 247-256, 2011.
S. H. Gilbert, A. P. Benson, P. Li, and A. V. Holden, "Regional localisation of left ventricular sheet structure: Integration with current models of cardiac fibre, sheet and band structure," Eur. J. Cardio-Thoracic Surg., vol. 32, No. 2, pp. 231-249, 2007.
Toussaint, N., Sermesant, M., Stoeck, C.T., Kozerke, S., Batchelor, P.G.: In vivo human 3D cardiac fibre architecture: reconstruction using curvilinear interpolation of diffusion tensor images, In: MIC-CAI (2010).
D. F. Scollan, A. Holmes, R. Winslow, and J. Forder, "Histological validation of myocardial microstructure obtained from diffusion tensor magnetic resonance imaging," Am. J. Physiol. Heart Circulatory Physiol., vol. 275, No. 6, pp. H2308-H2318, 1998.
L. Geerts, P. Bovendeerd, K. Nicolay, and T. Arts, "Characterization of the normal cardiac myofiber field in goat measured with mr-diffusion tensor imaging," Am. J. Physiol., Heart Circ. Physiol., vol. 283, pp. H139-H145, 2002.
H. Lombaert, J. Peyrat, P. Croisille, S, Rapacchi, L. Fanton, F. Cheriet, P. Clarysse, I.Magnin, H. Delingette, and N. Ayache, "Human atlas of the cardiac fiber architecture: Study on a healthy population," IEEE Trans.Med. Imag., vol. 31, No. 7, pp. 1436-1447. Jul. 2012.
J. C. Walker, J. M. Guccione, Y. Jiang, P. Zhang, A.W. Wallace, E. W. Hsu, and M. B. Ratcliffe, "Helical myofiber orientation after myocardial infarction and left ventricular surgical restoration in sheep," J. Thoracic Cardiovascular Surg., vol. 129, No. 2, pp. 382-390, 2005.
J. Chen, W. Liu, H. Zhang, L. Lacy, X. Yang, S.-K, Song, W. A. Wickline, and X. Yu, "Regional ventricular wall thickening reflects changes in cardiac fiber and sheet structure during contraction: Quantification with diffusion tensor MRI," Am. J. Physiol., Heart Circ. Physiol., vol. 289, pp. H1898-H1907, 2005.
D. Streeter and D. Bassett, "An engineering analysis of myocardial fiber orientation in pig's left ventricle in systole," Anatomical Rec., vol. 155, No. 4, pp. 503-511, 2005.
R. Deriche and D. Tschumperlé, "Diffusion PDE's on vectorvalued images: Local approach and geometric viewpoint," IEEE Signal Process. Mag., vol. 19, No. 5, pp. 16-25, 2002.
M. Martin-Fernandez, E. M. noz Moreno, L. Cammoun, J.-P. Thiran, C.-F. Westin, and C. Alberola-López, "Sequential anisotropic multichannel wiener filtering with Rician bias correction applied to 3d regularization of DWI data," Med. Image Anal., vol. 13, pp. 19-35, 2009.

(56) References Cited

OTHER PUBLICATIONS

Streeter DD, Powers WD, Alison Ross M, Torrent-Guasp F (1978) Three-dimensional fiber orientation in the mammalian heart. Cardiovascular System Dynamics (MIT Press, Cambridge, MA), pp. 73-84.

Streeter DD, Spotnitz HM, Patel DP, Ross J, Sonnenblick EH (1969) Fiber orientation in the canine left ventricle during diastole and systole. Circ Res 24:339-347.

Streeter DD, Hanna WT (1973) Engineering mechanics for successive states in canine left ventricular myocardium. II. Fiber angle and sarcomere length. Circ Res 33:656-664.

Peskin CS (1975) Mathematical Aspects of Heart Physiology (New York University.

Peskin CS (1989) Fiber architecture of the left ventricular wall: An asymptotic analysis. Commun Pur Appl Math 42:79-113.

Neville AC (1993) Biology of Fibrous Composites: Development Beyond the Cell Membrane (Cambridge Univ Press, Cambridge, UK).

Gilbert S, Benson A, Li P, Holden A (2007) Regional localisation of left ventricular sheet structure: Integration with current models of cardiac fibre, sheet and band structure. Eur J Cardiothorac Surg 32:231-249.

Blair DE, Vanstone JR (1978) A generalization of the helicoid. Minimal Submanifolds and Geodesics (Kaigai Publ, Tokyo), pp. 13-16.

Barbosa JM, Dajczer M, Jorge LP (1984) Minimal ruled submanifolds in spaces of constant curvature. Indiana U Math J 33:531-547.

Dillen F (1992) Ruled submanifolds of finite type. Proc Am Math Soc 114:795-798.

Thas C (1979) Minimal generalized ruled surfaces in the Euclidean space Em. Technical Report, Seminar of Higher Geometry (State University of Ghent, Belgium).

Thas C (1988) A property of the Veronese surface. J Geom 32:157-168.

Nitsche JJ (1989) Lectures on Minimal Surfaces: vol. 1, Introduction, Fundamentals, Geometry and Basic Boundary Value Problems (Cambridge Univ Press, Cambridge, UK).

Osserman R (2002) A Survey of Minimal Surfaces (Dover, Mineola, NY).

Savadjiev P (2009) Perceptual Organisation in Diffusion MRI: Curves and Streamline Flows. PhD thesis (McGill Univ, Montreal), p. 143.

Savadjiev P, Zucker SW, Siddiqi K (2007) On the differential geometry of 3D flow patterns: Generalized helicoids and diffusion MRI analysis. Proceedings of the IEEE 11th International Conference on Computer Vision, 10.1109/ICCV.2007.4409086.

LeGrice IJ, et al. (1995) Laminar structure of the heart: Ventricular myocyte arrangement and connective tissue architecture in the dog. Am J Physiol Heart and Circ Physiol 269:H571-H582.

Nielsen PM, LeGrice IJ, Smaill BH, Hunter PJ (1991) Mathematical model of geometry and fibrous structure of the heart. Am J Physiol Heart and Circ Physiol 260:H1365-1378.

LeGrice IJ, Hunter PJ, Smaill BH (1997) Laminar structure of the heart: A mathematical model. Am J Physiol Heart and Circ Physiol 272:H2466-H2476.

Piuze E, Kry PG, Siddiqi K (2011) Generalized helicoids for modeling hair geometry. Comput Graph Forum 30:247-256.

Hayden HA (1931) On a generalized helix in a Riemannian n-space. Proc Lond Math Soc s2-32:337-345.

Jones DK, ed. (2010) Diffusion MRI: Theory, Methods, and Applications (Oxford Univ Press, New York).

Chen J, et al. (2005) Regional ventricular wall thickening reflects changes in cardiac fiber and sheet structure during contraction: Quantification with diffusion tensor MRI. Am J Physiol Heart and Circ Physiol 289:H1898-H1907.

Hsu EW, Muzikant AL, Matulevicius SA, Penland RC, Henriquez CS (1998) Magnetic resonance myocardial fiber-orientation mapping with direct histological correlation. Am J Physiol Heart and Circ Physiol 274:H1627-H1634.

Tseng W-Yi,Wedeen VJ, Reese TG, Smith RN, Halpern EF (2003) Diffusion tensor MRI of myocardial fibers and sheets: Correspondence with visible cut-face texture. J Magn Reson Imaging 17:31-42.

Coghlan C, Hoffman J (2006) Leonardo da Vinci's flights of the mind must continue: Cardiac architecture and the fundamental relation of form and function revisited. Eur J Cardiothorac Surg 29(Suppl 1):S4-17.

Fisher RA (1953) Dispersion on a sphere. Proc R Soc London Ser A 217:295-305.

Spotnitz HM (2000) Macro design, structure, and mechanics of the left ventricle. J Thorac Cadiovasc Surg 119:1053-1077.

Aelen FW, et al. (1997) Relation between torsion and cross-sectional area change in the human left ventricle. J Biomech 30:207-212.

Arts T, Veenstra PC, Reneman RS (1984) Torsion of the left ventricle during the ejection phase in the intact dog. Cardiovasc Res 18:183-193.

Lumens J, Delhaas T, Arts T, Cowan BR, Young AA (2006) Impaired subendocardial contractile myofiber function in asymptomatic aged humans, as detected using MRI. Am J Physiol Heart Circ Physiol 291:H1573-H1579.

Bouligand Y (1972) Twisted fibrous arrangements in biological materials and cholesteric mesophases. Tissue Cell 4:189-217.

Jawad H, Lyon AR, Harding SE, Ali NN, Boccaccini AR (2008) Myocardial tissue engineering. Br Med Bull 87:31-47.

Tseng W-YI, Dou J, Reese TG,Wedeen VJ (2006) Imaging myocardial fiber disarray and intramural strain hypokinesis in hypertrophic cardiomyopathy with MRI. J Magn Reson Imaging 23:1-8.

Strijkers GJ, et al. (2009) Diffusion tensor imaging of left ventricular remodeling in response to myocardial infarction in the mouse. NMR Biomed 22:182-190.

Jones DK, Horsfield MA, Simmons A (1999) Optimal strategies for measuring diffusion in anisotropic systems by magnetic resonance imaging. Magn Res Med 42:515-525.

Borgefors G (1984) Distance transformations in arbitrary dimensions. Comput Vision Graph 27:321-345.

Athanasuleas, C.L., Buckberg, G.D., Stanley, A.W., Siler, W., Dor, V., Di Donato, M., Menicanti, L., De Oliveira, S.A., Beyersdorf, F., Kron, I.L., et al.: Surgical ventricular restoration in the treatment of congestive heart failure due to post-infarction ventricular dilation. Journal of the American College of Cardiology 44(7), 1439{1445 (2004).

Piuze, E., Lombaert, H., Sporring, J., Siddiqi, K.: Cardiac fiber inpainting using cartan forms. In: Medical Image Computing and Computer-Assisted Intervention MICCAI 2013, pp. 509-517. Springer (2013).

Rios, L.M., Sahinidis, N.V.: Derivative-free optimization: A review of algorithms and comparison of software implementations. Journal of Global Optimization 56(3), 1247{1293 (2013).

Sengupta, P.P., Korinek, J., Belohlavek, M., Narula, J., Vannan, M.A., Jahangir, A., Khandheria, B. K.: Left ventricular structure and function: basic science for cardiac imaging. Journal of the American College of Cardiology 48(10), 1988-2001 (2006).

Song, K., Nam, Y.J., Luo, X., Qi, X., Tan, W., Huang, G.N., Acharya, A., Smith, C.L., Tallquist, M.D., Neilson, E.G., et al.: Heart repair by reprogramming non-myocytes with cardiac transcription factors. Nature 485 (7400), 599-604 (2012).

\* cited by examiner

RECOVERY OF MISSING INFORMATION IN DIFFUSION MAGNETIC RESONANCE IMAGING DATA

CROSS-REFERENCE TO RELATED APPLICATIONS

This application claims priority under 35 U.S.C. 119(e) to U.S. application No. 62/160,694 filed May 13, 2015, entitled "Methods of Modelling and Characterizing Heart Geometry", the entire contents of which are hereby incorporated by reference.

TECHNICAL FIELD

The present invention relates to the field of data reconstruction in imaging, and particularly to recovering three-dimensional data that are missing or damaged from diffusion magnetic resonance imaging (dMRI) data.

BACKGROUND OF THE ART

Medical imaging is a growing field as the technology available to create visual representations of the interior of a body continues to advance. Such visual representations may be used for clinical analysis and/or medical intervention, as they reveal internal structures that are hidden by skin and bones.

Many different imaging techniques may be used to image the cardiovascular system, such as echocardiography, cardiac computed-tomography (CT), and magnetic resonance imaging (MRI). One particular imaging method well-suited for the cardiovascular system is Diffusion MRI (dMRI), which uses the Brownian motion of water molecules to generate contrast in magnetic resonance images. dMRI allows for the mapping of the diffusion process of molecules in biological tissues. The water molecule diffusion patterns can reveal microscopic details about tissue architecture in the heart.

As with any imaging technique, there are challenges associated with missing or damaged data points when reconstructing organs based on dMRI data. Among the presently available techniques for recovering missing information in dMRI are the interpolation of the diffusion tensor or the diffusion signal itself, and the application of rule-based methods. Each known method has its drawbacks, particularly with regards to recovering fiber orientation in regions where the data are missing or have been corrupted.

Therefore, there is room for improvement.

SUMMARY

There is described herein a method for recovering missing information in diffusion magnetic resonance imaging (dMRI) data. The data are modeled according to the theory of moving frames and regions where frame information is missing are reconstructed by performing diffusions into the regions. Local orthogonal frames computed along the boundary of the regions are rotated into the regions. Connection parameters are estimated at each new data point obtained by a preceding rotation, for application to a subsequent rotation.

In accordance with a first broad aspect, there is provided a method for recovering missing information in diffusion magnetic resonance imaging (dMRI) data. At each data point of the dMRI data, a local orthogonal frame is fitted and expressed as (i, j, k) to represent three directions. Connection parameters $c_{ijk}$ are determined at each data point to represent a rotation of the local orthogonal frame in a spatial neighborhood of the data point in accordance with the dMRI data. Inward diffusions are then performed into one or more regions where frame information is missing. The diffusions comprise rotating the local orthogonal frame in a heading direction at data points starting along a boundary of the region and moving into the region, and estimating connection parameters $c_{ijk}$ at each new data point obtained by a preceding rotation of the local orthogonal frame, for application to a subsequent rotation of the local orthogonal frame at the new data point.

In some embodiments, rotating the local orthogonal frame comprises computing new values for the three directions (i, j, k) independently.

In some embodiments, the method further comprises adjusting the computed new values to enforce orthogonality of the three directions (i, j, k).

In some embodiments, determining connection parameters $c_{ijk}$ at each data point of the dMRI data comprises computing closed-form connections in linear space.

In some embodiments, estimating connection parameters $c_{ijk}$ at each new data point comprises selecting a computation scheme from a group comprising finite differentiation, energy minimization, and closed-form connections in linear space.

In some embodiments, selecting the computation scheme comprises selecting as a function of local parameters of each one of the new data points.

In some embodiments, performing inward diffusions into a region of missing information comprises rotating the local orthogonal frame and estimating the connection parameters $c_{ijk}$ for a plurality of layers of the region in an iterative fashion.

In some embodiments, each one of the plurality of layers has a thickness corresponding to one voxel.

In some embodiments, fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

In some embodiments, the region is a volumetric region or a distributed region, and wherein missing information is recovered for a plurality of regions in the heart wall in order to reconstruct a three-dimensional image of fiber orientations.

In accordance with another broad aspect, there is provided a system for recovering missing information in diffusion magnetic resonance imaging (dMRI) data. The system comprises a processing unit and a non-transitory memory communicatively coupled to the processing unit and comprising computer-readable program instructions. The instructions are executable by the processing unit for fitting, at each data point of the dMRI data, a local orthogonal frame expressed as (i, j, k) to represent three directions; determining connection parameters $c_{ijk}$ at each data point to represent a rotation of the local orthogonal frame in a spatial neighborhood of the data point in accordance with the dMRI data; and performing inward diffusions into one or more regions where frame information is missing. The diffusions comprise rotating the local orthogonal frame in a heading direction at data points starting along a boundary of the region and moving into the region, and estimating connection parameters $c_{ijk}$ at each new data point obtained by a preceding rotation of the local orthogonal frame, for application to a subsequent rotation of the local orthogonal frame at the new data point.

In some embodiments, rotating the local orthogonal frame comprises computing new values for the three directions (i, j, k) independently.

In some embodiments, the program instructions are further executable for adjusting the computed new values to enforce orthogonality of the three directions (i, j, k).

In some embodiments, determining connection parameters $c_{ijk}$ at each data point of the dMRI data comprises computing closed-form connections in linear space.

In some embodiments, estimating connection parameters $c_{ijk}$ at each new data point comprises selecting a computation scheme from a group comprising finite differentiation, energy minimization, and closed-form connections in linear space.

In some embodiments, selecting the computation scheme comprises selecting as a function of local parameters of each one of the new data points.

In some embodiments, performing inward diffusions into a region of missing information comprises rotating the local orthogonal frame and estimating the connection parameters cijk for a plurality of layers of the region in an iterative fashion.

In some embodiments, each one of the plurality of layers has a thickness corresponding to one voxel.

In some embodiments, fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

In some embodiments, the region is a volumetric region or a distributed region, and wherein missing information is recovered for a plurality of regions in the heart wall in order to reconstruct a three-dimensional image of fiber orientations.

BRIEF DESCRIPTION OF THE DRAWINGS

Figure 3:
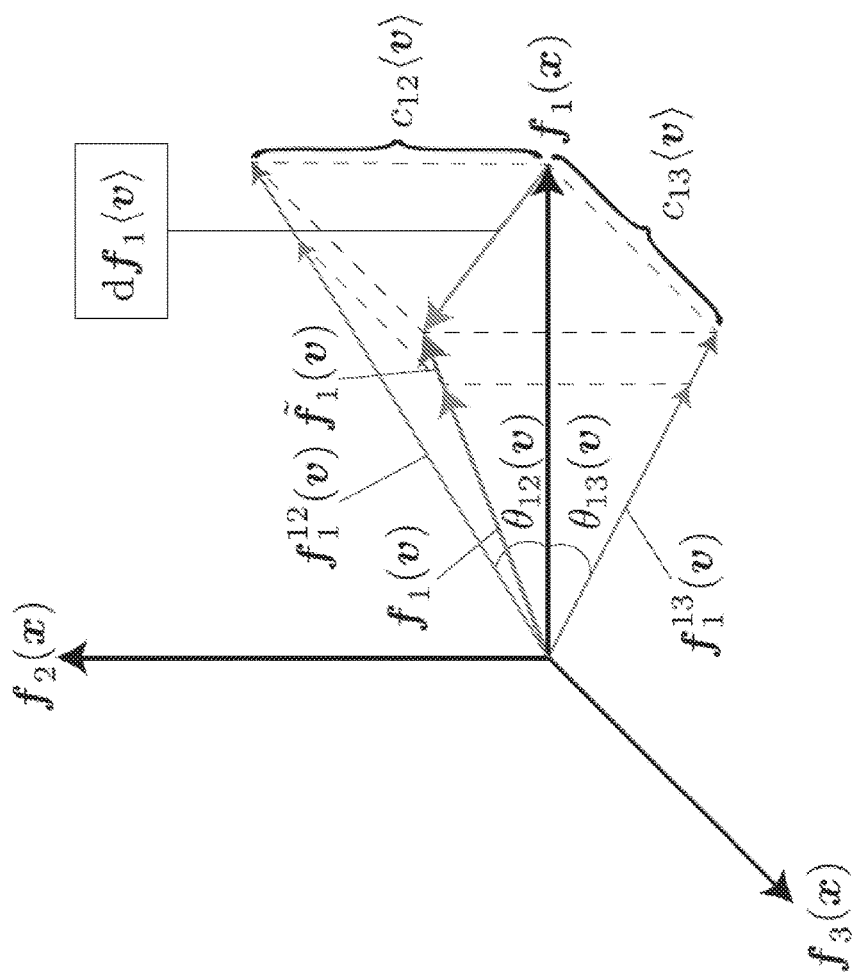
FIG. 3 illustrates a differential of the frame axis $f_1(x)$ expressed in local coordinates.

Further features and advantages of the present invention will become apparent from the following detailed description, taken in combination with the appended drawings, in which:

FIG. 1 is a flowchart of an exemplary computer-implemented method for recovering missing information in diffusion magnetic resonance imaging (dMRI) data;

FIG. 2A illustrates the turning of frame axes at x expressed in the local basis $f_1$, $f_2$, $f_3$ when x moves in the direction v;

FIG. 2B illustrates frame field variation characterized by the connections $c_{ijk}$ for i=1;

FIG. 3 illustrates a differential of the frame axis $f_1(x)$ expressed in local coordinates;

FIG. 4 is a flowchart of an example embodiment of the method of inward diffusion for regions having missing frame information;

FIG. 5 illustrates reconstructed volumes and errors using the proposed method for a damaged portion of a rat short-axis slab and a sparse rule-based synthetic field;

FIG. 6 illustrates mean angular reconstruction error $\epsilon_1$ between reconstructed fibers and the ground truth for increasingly Poisson-sparse volumes (top) using the proposed method, and reconstruction for increasingly interleaved volumes (bottom) in a long-axis cutout;

FIG. 7 illustrates mean volume error $\epsilon_1$ of reconstruction for various methods;

FIG. 8 illustrates an environment comprising a dMRI data reconstruction system;

FIG. 9 is a block diagram of an exemplary embodiment of the dMRI data reconstruction system;

FIG. 10 is a block diagram of an exemplary embodiment of a data modeling unit;

FIG. 11 is a block diagram of an exemplary embodiment of a data recovery unit; and FIG. 12 is a block diagram of an exemplary hardware and software implementation of the method of FIG. 1.

It will be noted that throughout the appended drawings, like features are identified by like reference numerals.

DETAILED DESCRIPTION

There is illustrated in FIG. 1 a flowchart of a computer-implemented method 100 for recovering missing information in diffusion Magnetic Resonance Imaging (dMRI) data. The method 100 is based on modelling the dMRI data in accordance with the theory of moving frames. Step 102 comprises fitting, at each data point of the dMRI data, a local orthogonal frame expressed as (i, j, k) to represent three directions. Step 104 comprises determining connection parameters $c_{ijk}$ at each data point to represent the rotation of the local orthogonal frame in the spatial neighborhood of the data point, so as to best fit the dMRI data. Steps 102 and 104 are presented mathematically below.

Let a point $x = \Sigma_i x_i e_i \in \Re^3$ be expressed in terms of $e_1$, $e_2$, $e_3$, the natural basis for $\Re^3$. Next, we define a right-handed orthonormal frame field $f_1, f_2, f_3 : \Re^3 \to \Re^3$. Each frame axis can be expressed by the rigid rotation $f_i = \Sigma_j a_{ij} e_j$ where $A = \{a_{ij}\} \in \Re^{3 \times 3}$ is a differentiable attitude matrix such that $A^{-1} = A^T$. Treating $f_i$ and $e_i$ as symbols, we can write Equation (1) below. Further, since each $e_i$ is constant, the differential geometry of the frame field is completely characterized by A. Taking the exterior derivative on both sides yields Equation (2) where d denotes the exterior derivative, and $C = (dA)A^{-1} = \{c_{ij}\} \in \Re^{3 \times 3}$ is the Maurer-Cartan matrix of connection forms $c_{ij}$. Writing $f_i$ as symbols, then Equation (2) can be understood as $df_i = \Sigma_j c_{ij} f_j$.

$$[f_1, f_2, f_3]^T = A[e_1 e_2 e_3]^T \qquad (1)$$

$$d[f_1, f_2, f_3]^T = (dA)A^{-1}[f_1, f_2, f_3]^T = C[f_1, f_2, f_3]^T \qquad (2)$$

$$C = \begin{bmatrix} 0 & c_{12} & c_{13} \\ -c_{12} & 0 & c_{23} \\ -c_{13} & -c_{23} & 0 \end{bmatrix} \qquad (3)$$

$$\tilde{f}_i(x_0 + v) = f_i + df_i(v) + \delta(\|v\|^2) \approx f_i + \sum_{j \neq i} f_j \sum_k v_k c_{ijk} \qquad (4)$$

The Maurer-Cartan matrix is a skew symmetric and hence referring to Equation (3) there are at most 3 independent, non-zero one-forms: $c_{12}$, $c_{13}$, and $c_{23}$. One-forms operate on tangent vectors through a process denoted contraction, written as $dw\langle v \rangle \in \Re$ for a general one-form $dw(v) = \Sigma_i w_i de_i$ and tangent vector v on $\Re^3$, which yields $dw\langle v \rangle = \Sigma_i w_i de_i \langle \Sigma_j v_j e_j \rangle = \Sigma_i w_i v_i$ since $de_i \langle e \rangle = \delta_{ij}$, where $\delta_{ij}$ is the Kronecker delta.

The space of linear models for smooth frame fields is fully parametrized by the one-forms $c_{ij}$. This space can be explored by considering the motion of $f_i$ in a direction $v=\Sigma_k v_k f_k$ using the first order terms of a Taylor series centered at $x_0$ as given by Equation (4) where $f_i$ and $df_j$ are evaluated at $x_0$, and $c_{ijk} \equiv c_{ij} \langle f_k \rangle$ are the connection forms of the local frame. Since only 3 unique non-zero combinations of $c_{ij}$ are possible, there are in total 9 connections $c_{ijk}$. These coefficients express the rate of turn of the frame vector $f_i$ towards $f_j$ when x moves in the direction $f_k$. Referring to FIGS. 2A and 2B, there is illustrated the behavior of the frame field described by $c_{ijk}$. For example, with $f_1$ taken to be the local orientation of a fiber and $f_3$ taken to be the component of the heart wall normal orthogonal to $f_1$, then $c_{131}$ measures the circumferential curvature of a fiber and $c_{123}$ measures the change in its helix angle. FIG. 2A illustrates the turning of frame axes at x expressed in the local basis $f_1$, $f_2$, $f_3$ when x moves in the direction v. FIG. 2B illustrates the frame field variation characterized by the connections $c_{ijk}$ for i=1.

A first order generator for frame fields using Equation (4) requires knowledge of the underlying connection forms $c_{ijk}$. Three different ways of computing the connection forms $c_{ijk}$ may be used. The computation schemes are referred to herein as finite differentiation, energy minimization, and closed-form connections in linear space.

The finite differentiation computation scheme is a direct estimate based on finite differences. In smooth frame fields, the connection one-forms $c_{ij}$ can be directly obtained using Equation (2), i.e., $df_i \cdot f_k = (\Sigma_j c_{ij} f_j) \cdot f_k = \Sigma_j c_{ij} \delta_{jk} = c_{ik}$. The differentials $df_i$ can be computed by applying the exterior derivative for a function, i.e., for the k'th component $f_i$, $f_{ik}: \mathfrak{R}^3 \to \mathfrak{R}$, $$df_{ik} = \sum_l^3 \frac{\delta f_{ik}}{\delta x_l} de_l$$

as given by Equation (5) where $$J_i = \left[ \frac{\delta f_{ik}}{\delta x_q} \right] \in \mathfrak{R}^{3 \times 3}$$

is the Jacobian matrix of partial derivatives of $f_i$. Now setting $v=f_k$ we obtain Equation (6). The Jacobian matrix $J_i$ can be approximated to first order using, e.g., finite differences on $f_i$ with a spacing of size $\delta x$:

$$\frac{\delta f_{ij}}{\delta x_k}(x) \approx \frac{f_{ij}(x+e_k) - f_{ij}(x)}{\delta x},$$

$$df_i \cdot f_j(v) = f_j^T df_i(v) = \sum_k^3 \sum_l^3 f_{jk} \frac{\delta f_{ik}}{\delta x_l} de_l(v) = f_j^T J_i v \quad (5)$$

$$c_{ijk} = f_j^T J_i f_k \quad (6)$$

The energy minimization computation scheme is a regularized optimization scheme. The connection forms $c_{ijk}$ at $x_0$ can be obtained as the minimizer of an extrapolation energy $\xi$ contained within a neighborhood $\Omega$ as given by Equation (7) where $\lambda$ is a regularization weight used to penalize high curvature. Denoting $\tilde{f}_i$ as the normalized approximation to $f_i$ at $x_0+v$ using Equation (4) then we can choose $\xi$ to minimize the angular error between $\tilde{f}_i$ and $f_i$:

$$\xi(x_0, \Omega) = \frac{1}{|\Omega|} \sum_{v \in \Omega} \sum_i^3 \omega \varepsilon_i(x_0+v),$$

with $\varepsilon_i(x_0+v) = \text{ar} \cos(f_i(x_0+v) \cdot \tilde{f}_i(x_0+v))$.

$$c_{ijk}^*(x_0) = \underset{c_{ijk}}{\text{argmin}} \xi(x_0, \Omega) + \lambda |c_{ijk}| \quad (7)$$

The closed form connections in linear space computation scheme is based on trigonometrical considerations in the first-order structure of 3D frame fields and enforces the requirement that $c_{ij} \langle v \rangle = \Sigma_k c_{ijk} v_k$. This requirement is not explicitly enforced in the finite differentiation and energy minimization computation schemes. The closed form connections in linear space computation scheme also provides exact $c_{ijk}$ measurements in manifolds that have low second-order curvatures ($d^2 f_i \to 0$). Given a local basis $f_i$ and data-driven neighboring bases $f_i(v \in \Omega)$, the one-forms $c_{ij} \langle v \rangle$ can be solved for using linear least-squares. We begin by expanding Equation (4) to yield Equation (8) and analyze this expression geometrically using FIG. 3.

$$f_i(v) = f_i + c_{ij} \langle v \rangle f_j + c_{ik} \langle v \rangle f_k \quad (8)$$

Let $f\{(v)\}$ denote the projection of $f_i(v)$ in the $f_i-f_j$ plane, i.e. $f_i^j(v) = f_i(v) - (f_i(v) \cdot f_k) f_k$, $k \in (1,2,3) \neq i \neq j$ and let $\theta_{ij}(v)$ denote the signed angle between $f_i$ and $f_i^j(v)$ with positive values assigned to $\theta_{ij}(v)$ rotating $f_i$ towards $f_j$, obtained as Equation (9). Using trigonometry, we obtain Equation (10). Then by expanding the contraction $c_{ij} \langle v \rangle$ we obtain Equations (11) to (13) which when substituted into Equation (10) yield Equation (14) wherein we have a linear system in the nine unknowns $c_{ijk}$. Now, aggregating n measurements $v_i \in \Omega(x)$ yields Equation (15).

$$\theta_{ij}(v) = \text{sgn}(f_i^j(v) \cdot f_j) \cdot \arccos\left( \left| \frac{f_i \cdot f_i^j(v)}{\|f_i^j(v)\|} \right| \right) \quad (9)$$

$$\tan(\theta_{ij}(v)) = \frac{c_{ij}(v)}{\|f_i\|} = c_{ij} \langle v \rangle \text{ since } f_i \text{ is a unit vector} \quad (10)$$

$$c_{ij} \langle v \rangle = (v \cdot f_1) c_{ij1} + (v \cdot f_2) c_{ij2} + (v \cdot f_3) c_{ij3} \quad (11)$$

$$= v_1 c_{ij1} + v_2 c_{ij2} + v_3 c_{ij3} \quad (12)$$

with $v_k = v \cdot f_k$ $$\Rightarrow [c_{12}(v) c_{13}(v) c_{23}(v)] = [v_1 v_2 v_3] \cdot \begin{bmatrix} c_{121} & c_{131} & c_{231} \\ c_{122} & c_{132} & c_{232} \\ c_{123} & c_{133} & c_{233} \end{bmatrix} \quad (13)$$

$$\begin{bmatrix} v_1 \\ v_2 \\ v_3 \end{bmatrix}^T \begin{bmatrix} c_{121} & c_{131} & c_{231} \\ c_{122} & c_{132} & c_{232} \\ c_{123} & c_{133} & c_{233} \end{bmatrix} = \begin{bmatrix} \tan(\theta_{12}(v)) \\ \tan(\theta_{13}(v)) \\ \tan(\theta_{23}(v)) \end{bmatrix}^T \quad (14)$$

$$\begin{bmatrix} v_{11} & v_{12} & v_{13} \\ \cdots & \cdots & \cdots \\ v_{i1} & v_{i2} & v_{i3} \\ \cdots & \cdots & \cdots \\ v_{n1} & v_{n2} & v_{n3} \end{bmatrix} \begin{bmatrix} c_{121} & c_{131} & c_{231} \\ c_{122} & c_{132} & c_{232} \\ c_{123} & c_{133} & c_{233} \end{bmatrix} = \begin{bmatrix} \tan(\theta_{12}(v_1)) & \tan(\theta_{13}(v_1)) & \tan(\theta_{23}(v_1)) \\ \cdots & \cdots & \cdots \\ \tan(\theta_{12}(v_i)) & \tan(\theta_{13}(v_i)) & \tan(\theta_{23}(v_i)) \\ \cdots & \cdots & \cdots \\ \tan(\theta_{12}(v_n)) & \tan(\theta_{13}(v_n)) & \tan(\theta_{23}(v_n)) \end{bmatrix} \quad (15)$$

Accordingly, we require n≥3 otherwise the system will be undetermined. In general, $v_i \cdot v_j \neq 0$ such that V is not a full row rank. A QR factorization or singular value decomposition (SVD) pseudoinverse process can be used to solve for C $C=(V^TV)^{-1}V^T\tilde{C}$.

Referring back to FIG. 1, once the dMRI data have been modeled in accordance with the theory of moving frames, and more specifically that local orthogonal frames are fitted at each data point, as per step 102, and connection parameters $c_{ijk}$ are computed at each data point, as per step 104, the method 100 moves on to step 106 of performing inward diffusions into one or more regions where frame information is missing. An example embodiment of step 106 is illustrated in FIG. 4.

The region of missing information may be a volumetric region or a distributed region. In some data sets, there may be a combination of volumetric regions and distributed regions for which frame information is missing. The regions may be reconstructed sequentially or in parallel.

Each region is defined by a boundary and inward diffusions are performed starting from the boundary and into the region. As per step 402, each local orthogonal frame is rotated in a heading direction for the data points at the boundary of the region. New values for the three directions (i, j, k) are computed at the new data points. At step 404, connection parameters $c_{ijk}$ are estimated at each new data point obtained by the rotation of step 402. The estimated parameters $c_{ijk}$ are then used to further rotate the local orthogonal frames into the region, as per step 406.

In some embodiments, the method 106 is performed iteratively, in a layer-by-layer fashion. For example, if the region to be reconstructed were to be spherical, then the layers would be concentric spherical shells of decreasing diameters. For a non-spherical region, the layers may have a shape that corresponds to the shape of the boundary of the region. The layers may be set out evenly, such that each layer has a same thickness, or they may be set out unevenly, such that the thickness varies from one layer to another. Similarly, a given layer may have a constant thickness or a thickness that varies throughout the layer. The thickness of each layer may be set as desired, for example at one voxel, two voxels, three voxels, and the like.

Alternatively, the region is divided into a plurality of sub-regions, and the inward diffusions are performed separately in each sub-region. The order of diffusion for the sub-regions may be set in accordance with available data points from the dMRI data, such that a first rotation of the local frames as per step 402 is performed from known data points. This embodiment may be more suitable for distributed regions, whereas the layer-by-layer approach may be favored for volumetric regions. Other approaches for performing the inward diffusion of regions where frame information is missing may also be used.

In some embodiments, rotating the local orthogonal frame comprises computing new values for the three directions (i, j, k) independently. There may be a need to adjust the newly computed values of the three directions (i, j, k) so as to enforce orthogonality, as per step 408. As illustrated in FIG. 4, step 408 may be performed after the first rotation from the data points on the boundary of the region, and/or it may be performed after each additional rotation from a new data point further into the region.

Step 106 of inward diffusions into regions where frame information is missing will now be described mathematically. We define $\Omega$ as a region where frame field data are available, and A as a reconstruction domain. Starting with $A^0=A$ each iteration propagates information on the boundary $\delta A^n$ such that $\delta A^{n+1}=\delta A^n \otimes B_r$ is eroded with a ball element $B_r$ of radius r=1 and $c_{ijk}$ is updated in $\Omega$ and $\vartheta A^{n+1}$ until $A^{n+1} = \vartheta$. Frames $f_i$ are transported from $x \in \delta A^n$ in a direction v across $\delta A$ using a neighbor accumulation of Equation (4) as given by Equation (16) which is then normalized.

$$\tilde{f}_i^{n+1}|_{x+v} = \sum_{x \in \delta A^n} \left( f_i^n \Big|_x + \sum_{j \neq i} f_j^n \Big|_x \left[ \sum_k c_{ijk}(x+v) \cdot f_k^n \Big|_x \right] \right) \quad (16)$$

In some embodiments, connection forms $c_{ijk}$ at $x \in \delta A^n$ are obtained by combining the three computation schemes described above, namely finite differentiation, energy minimization, and closed-form connections in linear space. For each data point, the computation scheme may be selected based on the following heuristics in Equation (17), where $k=\|V^{-1}\|_F\|V\|_F$ is the condition number of V in Equation (15) and F is the Frobenius norm where $N=\frac{1}{2}(2r+1)^3$ and $\kappa_0=3$ were determined empirically and generally offer a good tradeoff between neighborhood connectivity and well-conditioning of V.

$$c_{ijk}(x) = \begin{cases} \text{Closed form of Equation (15): } x > N \text{ neighbours} \\ \qquad \text{and } \kappa < \kappa_0 \\ \text{Energy of Equation (7): } \lambda = 0.0001 \text{ \& seeding} \\ \qquad \text{with Equation (6): else} \end{cases} \quad (17)$$

Note that unrealistically large $c_{ijk}$ values can still arise in spite of the regularization. To see this, take $f_1(x)$ and make it parallel to $f_2(x)$ in a neighboring voxel. Using Equation (4) we have $f_1(v) \approx f_1+c_{12}(v)f_2+c_{13}(v)f_3 m$ such that $f_1(v)\|f_2(v) \Rightarrow c_{12}\langle v \rangle \to \infty$.

In some embodiments, a hard threshold may be applied on $\xi$ and $c_{ijk}$ in Equation (17). To do this we set $$c_{ijk} = 0 \text{ if } \xi > \frac{\pi}{4}$$

or if $c_{ijk}$ exceeds bounds obtained as follows. In the discrete case using forward differences, the frame axis differential $d(f_{i1}e_1+f_{i2}e_2+f_{i3}e_3)$ is bounded by $$\left| \frac{\delta f_i}{\delta x_k} \right| \approx \frac{1}{2} |f_{ij}(x+e_k) - f_{ij}(x)| \leq 1$$

and $\|f_j\|=1$. We thus have $|c_{ij}(v)|=|f_j^T \mathfrak{I}_{f_i}(x_1,x_2,x_3)v| \le f_j^T \cdot [\|v\|_1, \|v\|_2, \|v\|_3]^T \le \|v\|_1$, and set $c_{ijk}=\min(c_{ijk}, \|v\|_1)$.

The diffusion process guided by Equations (16) and (17) does not enforce orthogonality of the resulting frame field. Since this is a first-order method, there may be some orthogonality drift as the process gets deeper into the region A. To see this, using Equation (8), we get $$f_1(v) \cdot f_2(v) = (f_1 + c_{12}(v)f_2 + c_{13}(v)f_3) \cdot (f_2 + c_{21}(v)f_1 c_{23}(v)f_3)$$  (10)

and similarly for the other axis products. Since $f_i$ is by definition orthogonal at 0, we have $f_i \cdot f_j = \delta_{ij}$ such that $$f_i(v) \cdot f_2(v) = \begin{cases} 1 + c_{ij}^2 + c_{ik}^2 : i = j \\ c_{ik} c_{jk} : i \ne j \end{cases} \text{ for } k \ne i, k \ne j.$$

The extrapolated frame $f_i(v)$ will therefore never be exactly orthonormal. To enforce orthonormality we therefore fix $f_1(v)$ and find its orthogonal complement $f'\!\!\tfrac{1}{2}(v)$ using Equations (18) and (19) where $c_{ij}$ is taken as $c_{ij}(v)$. We similarly proceed with $f'\!\!\tfrac{1}{3}(v)$.

$$f\tfrac{1}{2}(v) = f - (f_1(v) \cdot f_2(v))f_1(v) \quad (18)$$

$$= (-c_{12} - c_{13}c_{23})f_1 + (1 - c_{13}c_{23}c_{13})f_2 + (c_{23} - c_{13}^2 c_{23})f_3 \quad (19)$$

The method 100 may be applied to reconstruction of various internal organs, such as, but not limited to the brain, the kidney and the pancreas. In some embodiments, the method 100 is applied to cardiac fiber reconstruction, i.e. the heart. For example, the dMRI data may be used to obtain a first direction for the local orthogonal frames whereas the other two directions are based on the local geometry of a heart wall. Therefore, the method 100 may be used to reconstruct a three-dimensional image of fiber orientations.

Given a partial volume $\Omega$ of fiber orientations $f_1$ in a mask H of the heart, $f_1$ may be reconstructed everywhere in $A = H - \Omega$. For cardiac fiber reconstruction, step 106 of method 100 may be guided by rule-based priors for fiber orientations based on H and estimated heart wall normal directions of which one relates to the circumferential arrangement of myofibers and the other to their helix angle turning.

The circumferential component may be estimated as follows. Using a smoothing kernel $G_\sigma$, the Euclidean distance transforms $G_\sigma * D_+$ and $G_\sigma * D_-$ to the outer and inner walls are first computed. From the average $D = \tfrac{1}{2}(D_+ - D_-)$ local wall normal directions are computed using $\hat{f}_3 = \nabla D$. The apex $\xi_0$ and an upward $\hat{u}$ are identified, and used to obtain heart centerline measurements $\xi_t$, parametrized over $t$ steps along $\hat{u}$, such that:

$$\xi_t = \frac{\sum_x w(x)\Xi(x)x}{\sum_x w(x)\Xi(x)}, \text{ where } \Xi(x) = \text{sgn}(|(x - \xi_0 - t\hat{u}) \cdot \hat{u}|)$$

In other words, $\Xi(x)$ is 1 in the current short axis plane and 0 elsewhere, and:

$$w(x) = \begin{cases} 1: x \text{ in\_the\_myocardian} \\ 0: \text{else} \end{cases}$$

Then, a smooth heart centerline is obtained as $L(t) = G_\sigma * \xi_t$. We can now obtain a local long-axis direction $f_L$ using $$f_L = \frac{\delta L(t)}{\delta t}$$

and finally estimate the circumferential direction $f_C$ from the cross product of $f_L$ and the local wall normal $\hat{f}_3$ as $f_c = f_L \times f_3$.

The helical component may be estimated as follows. A rule-based helix angle variation prior is used, from $\alpha^+$ to $\alpha^-$ from outer to inner wall. A voxel x is first parametrized over the local depth of the heart wall in the range [0, 1], where 0 indicates that the voxel is lying on the outer wall and $f_L$ on the inner wall, using:

$$\gamma(x) = \frac{D_+}{D_+ + D_-}(x) = (1 + D_- D_+^{-1})^{-1}(x) \in [0, 1]$$

Then, the local helix angle at x is linearly interpolated using:

$$\alpha(x) = (\alpha_+ - \gamma\alpha_+ + \gamma\alpha_-)(x).$$

Finally, the helix fiber direction $\hat{f}_1$ is obtained using a helical rotation of $f_c$ about the local transmural axis $\hat{f}_3$ from the axis angle $\langle \hat{f}_3, \alpha \rangle$ using Rodrigues' formula:

$$\hat{f}_1 = \cos\alpha f_C + \sin\alpha(\hat{f}_3 \times f_C) + (1-\cos\alpha)(\hat{f}_3 \cdot f_C)\hat{f}_3$$

Each diffusion pass $n+1$ combines current frame field estimates $f_i$, differentials $df_i$ and rule-based priors $\hat{f}_i$ using $$\tilde{f}_1^{n+1} = \phi_1 \hat{f}_1(x) + (1-\phi_1)\sum_{y \in \partial A}\left(\tilde{f}_1^n + c_{12}(v)\tilde{f}_2^n + c_{13}(v)\tilde{f}_3^n\right)$$

$$\tilde{f}_3^{n+1} = \phi_3(\tilde{f}_3 - (\tilde{f}_3 \cdot \tilde{f}_1^n)\tilde{f}_1^n) + (1-\phi_3 \tilde{f}_3(x)), \quad \tilde{f}_2^{n+1} = \tilde{f}_3^{n+1} \times \tilde{f}_1^{n+1}$$

Here, $v = x-y$, $\delta\Omega(x)$ denotes the current (diffused) boundary around x from which data are recovered, and $\phi_1 = 0.1$, $\phi_3 = 0.7$ are prior weights determined empirically. The higher the confidence in the rule-based model, the larger these coefficients should be. Each $\tilde{f}_i^{n+1}$ is normalized after each diffusion pass.

Damaged diffusion volumes were simulated using Poisson disk stochastic sampling, where each sample point p satisfies a minimum distance constraint to others. At p, an ellipsoid with random semi-axis lengths (range=: 1 to 10 voxels) is carved out. A prototypical synthetic in vivo mask was also obtained by regularly slicing H along its long-axis. The corruptions were applied to dMRI volumes of a healthy rat heart. Subsequently, the method 100 was compared against a standard vector interpolation scheme based on distance weighting, against a pure vector diffusion scheme using Equation (16) with $c_{ijk}=0$, and against a ruled-based model. The robustness to noise was also tested by combining Poisson sampling and random angular perturbations to $f_1$, prior to reconstruction.

FIG. 5 depicts the reconstruction of synthetic cardiac fiber fields respectively generated in a short axis slab near the mid-section from which a chunk of tissue was removed, and from a synthetic transmural cardiac sample obtained using a rule-based helix angle variation (total turning 120 degrees). The reconstruction method 100 shows a significantly reduced angular error compared to other methods.

FIG. 6 shows Poisson and slicing error maps using the method 100 according to one embodiment. The error increases with the amount of damage, and is higher near boundaries.

Referring to FIG. 7 there are compared mean reconstruction errors for the different methods. The method 100, referred to in FIG. 7 as "Frame Inpainting", outperforms the other methods in minimizing the reconstruction error in all corruption scenarios, and also shows comparable robustness to noise.

Turning to FIG. 8, there is illustrated a dMRI data reconstruction system 802. The system 802 may be implemented as a downloaded software application, a firmware application, or a combination thereof. The system 802 may be accessible remotely from any one of a plurality of devices 806 over connections 804. The devices 806 may comprise any device, such as a personal computer, a tablet, a smart phone, or the like, which is configured to communicate over the connections 804. In some embodiments, the system 802 may itself be provided directly on one of the devices 806, either as a downloaded software application, a firmware application, or a combination thereof.

The connections 804 may comprise wire-based technology, such as electrical wires or cables, and/or optical fibers. The connections 804 may also be wireless, such as RF, infrared, Wi-Fi, Bluetooth, and others. Connections 804 may therefore comprise a network, such as the Internet, the Public Switch Telephone Network (PSTN), a cellular network, or others known to those skilled in the art. Communication over the network may occur using any known communication protocols that enable devices within a computer network to exchange information. Examples of protocols are as follows: IP (Internet Protocol), UDP (User Datagram Protocol), TCP (Transmission Control Protocol), DHCP (Dynamic Host Configuration Protocol), HTTP (Hypertext Transfer Protocol), FTP (File Transfer Protocol), Telnet (Telnet Remote Protocol), SSH (Secure Shell Remote Protocol).

One or more databases 808 may be integrated directly into the system 802 or any one of the devices 806, or may be provided separately therefrom (as illustrated). In the case of a remote access to the databases 808, access may occur via connections 804 taking the form of any type of network, as indicated above. The various databases 808 described herein may be provided as collections of data or information organized for rapid search and retrieval by a computer. The databases 808 may be structured to facilitate storage, retrieval, modification, and deletion of data in conjunction with various data-processing operations. The databases 808 may be any organization of data on a data storage medium, such as one or more servers. The databases 808 illustratively have stored therein any one of datasets of dMRI data, computed local orthogonal frame directions (i, j, k), $c_{ijk}$ parameters, data defining boundaries of regions to reconstruct, reconstructed images, partially reconstructed images, and any other information used for the methods described herein.

FIG. 9 is an example embodiment of the system 702. A data modeling unit 902 is configured to receive input data, such as dMRI data, and perform initial modeling steps of the data in accordance with the theory of moving frames, as per steps 102 and 104 of the method 100. Once the dMRI data are modeled, the data are transmitted to a data recovery unit 904, configured to perform step 106 of method 100. In some embodiments, the boundaries of regions to be reconstructed are defined by the data modeling unit 902 and provided to the data recovery unit 904. Alternatively, the data recovery unit 904 is configured to identify the regions to be reconstructed and define the boundaries.

FIG. 10 is an example embodiment of the data modeling unit 902, which illustratively comprises a fitting unit 1002 and a connection parameters computation unit 1004. The fitting unit 1002 may be configured to receive the dMRI data and compute the local orthogonal frame directions at each data point of the dMRI data. The connection parameters computation unit 1004 may be configured to compute the connection parameters $c_{ijk}$ in accordance with any one of the computation schemes described above, namely finite differentiation, energy minimization, and closed-form connections in linear space. Other computation schemes may also be used. In some embodiments, the closed-form connections computation scheme is used exclusively for computing the connection parameters $c_{ijk}$ of the known data, whereas a combination of computation schemes is used to estimate the connection parameters $c_{ijk}$ in the regions to be reconstructed. The connection parameters computation unit 1004 outputs a partially reconstructed image, with or without the boundaries of regions for reconstruction having been defined.

FIG. 11 is an example embodiment of the data recovery unit 904. There is provided a frame rotation unit 1102 and a connection parameters estimation unit 1104. The frame rotation unit 1102 receives the partially reconstructed image, which may be represented as the computed frame directions (i, j, k) at each known data point and corresponding connection parameter $c_{ijk}$. Alternatively, the information input to the frame rotation unit 1102 is composed only of data points found at the boundaries of the regions to be reconstructed. Irrelevant data points, i.e. those not needed to perform the steps of rotation 402 and estimation 404, may be omitted. The connection parameters estimation unit 1104 is configured to receive the newly computed frame values after a rotation, and estimate connection parameters $c_{ijk}$ for the newly computed frame values. As indicated above, the process may be performed iteratively until each region has been fully reconstructed, or until a threshold has been reached regarding recovered data. A reconstructed image may be output.

Note that while illustrated separately, the connection parameters computation unit 1004 and the connection parameters estimation unit 1104 may be provided as a single unit that can perform both computation based on obtained dMRI data and estimation based on rotated local orthogonal frames. Similarly, the two units 1004 and 1104 may share certain resources. Other units may also be combined or separated as desired to suit the targeted functions.

FIG. 12 shows a schematic representation of an example implementation of the method 100 as a combination of software and hardware components. A computing device 1200 is illustrated with one or more processing units (referred to as "the processing unit 1202") and one or more computer-readable memories (referred to as "the memory 1204") having stored thereon program instructions 1206 configured to cause the processing unit 1202 to generate one or more outputs based on one or more inputs. The inputs may comprise the dMRI data and any additional information needed to perform the method 100. The outputs may comprise partially reconstructed images, fully reconstructed images, and any other information resulting from performing any step of the method 100.

The processing unit 1202 may comprise any suitable devices configured to cause a series of steps to be performed so as to implement the computer-implemented method 100 such that instructions 1206, when executed by a computing device 1200 or other programmable apparatus, may cause the functions/acts/steps specified in the methods described herein to be executed. The processing unit 1202 may comprise, for example, any type of general-purpose microprocessor or microcontroller, a digital signal processing (DSP) processor, a central processing unit (CPU), an integrated circuit, a field programmable gate array (FPGA), a reconfigurable processor, other suitably programmed or programmable logic circuits, or any combination thereof.

The memory 1204 may comprise any suitable known or other machine-readable storage medium. The memory 1204 may comprise non-transitory computer readable storage medium such as, for example, but not limited to, an electronic, magnetic, optical, electromagnetic, infrared, or semiconductor system, apparatus, or device, or any suitable combination of the foregoing. The memory 1204 may include a suitable combination of any type of computer memory that is located either internally or externally to device such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. Memory may comprise any storage means (e.g., devices) suitable for retrievably storing machine-readable instructions executable by processing unit.

Each computer program described herein may be implemented in a high level procedural or object-oriented programming or scripting language, or a combination thereof, to communicate with a computer system. Alternatively, the programs may be implemented in assembly or machine language. The language may be a compiled or interpreted language. Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

While illustrated in block diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. The structure illustrated is thus provided for efficiency of teaching the present embodiment.

The above description is meant to be exemplary only, and one skilled in the relevant arts will recognize that changes may be made to the embodiments described without departing from the scope of the invention disclosed. For example, the blocks and/or operations in the flowcharts and drawings described herein are for purposes of example only. There may be many variations to these blocks and/or operations without departing from the teachings of the present disclosure. For instance, the blocks may be performed in a differing order, or blocks may be added, deleted, or modified.

The present disclosure may be embodied in other specific forms without departing from the subject matter of the claims. Also, one skilled in the relevant arts will appreciate that while the systems, methods and computer readable mediums disclosed and shown herein may comprise a specific number of elements/components, the systems, methods and computer readable mediums may be modified to include additional or fewer of such elements/components. The present disclosure is also intended to cover and embrace all suitable changes in technology. Modifications which fall within the scope of the present disclosure will be apparent to those skilled in the art, in light of a review of this disclosure, and such modifications are intended to fall within the appended claims.

The invention claimed is:

1. A method for recovering missing information in diffusion magnetic resonance imaging (dMRI) data, the method comprising:
fitting, at each data point of the dMRI data, a local orthogonal frame expressed as (i, j, k) to represent three directions;
determining connection parameters $c_{ijk}$ at each data point to represent a rotation of the local orthogonal frame in a spatial neighborhood of the data point in accordance with the dMRI data; and
performing inward diffusions into a region where frame information is missing by:
rotating the local orthogonal frame in a heading direction at data points starting along a boundary of the region and moving into the region; and
estimating connection parameters $c_{ijk}$ at each new data point obtained by a preceding rotation of the local orthogonal frame, for application to a subsequent rotation of the local orthogonal frame at the new data point.

2. The method of claim 1, wherein rotating the local orthogonal frame comprises computing new values for the three directions (i, j, k) independently.

3. The method of claim 2, further comprising adjusting the computed new values to enforce orthogonality of the three directions (i, j, k).

4. The method of claim 1, wherein determining connection parameters $c_{ijk}$ at each data point of the dMRI data comprises computing closed-form connections in linear space.

5. The method of claim 1, wherein estimating connection parameters $c_{ijk}$ at each new data point comprises selecting a computation scheme from a group comprising finite differentiation, energy minimization, and closed-form connections in linear space.

6. The method of claim 5, wherein selecting the computation scheme comprises selecting as a function of local parameters of each one of the new data points.

7. The method of claim 1, wherein performing inward diffusions into a region of missing information comprises rotating the local orthogonal frame and estimating the connection parameters $c_{ijk}$ for a plurality of layers of the region in an iterative fashion.

8. The method of claim 7, wherein each one of the plurality of layers has a thickness corresponding to one voxel.

9. The method of claim 1, wherein fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

10. The method of claim 9, wherein the region is a volumetric region or a distributed region, and wherein missing information is recovered for a plurality of regions in the heart wall in order to reconstruct a three-dimensional image of fiber orientations.

11. A system for recovering missing information in diffusion magnetic resonance imaging (dMRI) data, the system comprising:
a processing unit; and
a non-transitory memory communicatively coupled to the processing unit and comprising computer-readable program instructions executable by the processing unit for:
fitting, at each data point of the dMRI data, a local orthogonal frame expressed as (i, j, k) to represent three directions;
determining connection parameters $c_{ijk}$ at each data point to represent a rotation of the local orthogonal frame in a spatial neighborhood of the data point in accordance with the dMRI data; and
performing inward diffusions into a region where frame information is missing by:
rotating the local orthogonal frame in a heading direction at data points starting along a boundary of the region and moving into the region; and
estimating connection parameters $c_{ijk}$ at each new data point obtained by a preceding rotation of the local orthogonal frame, for application to a subsequent rotation of the local orthogonal frame at the new data point.

12. The system of claim 11, wherein rotating the local orthogonal frame comprises computing new values for the three directions (i, j, k) independently.

13. The system of claim 12, wherein the program instructions are further executable for adjusting the computed new values to enforce orthogonality of the three directions (i, j, k).

14. The system of claim 11, wherein determining connection parameters $c_{ijk}$ at each data point of the dMRI data comprises computing closed-form connections in linear space.

15. The system of claim 11, wherein estimating connection parameters $c_{ijk}$ at each new data point comprises selecting a computation scheme from a group comprising finite differentiation, energy minimization, and closed-form connections in linear space.

16. The system of claim 15, wherein selecting the computation scheme comprises selecting as a function of local parameters of each one of the new data points.

17. The system of claim 11, wherein performing inward diffusions into a region of missing information comprises rotating the local orthogonal frame and estimating the connection parameters $c_{ijk}$ for a plurality of layers of the region in an iterative fashion.

18. The system of claim 17, wherein each one of the plurality of layers has a thickness corresponding to one voxel.

19. The system of claim 11, wherein fitting, at each data point of the dMRI data, a local orthogonal frame expressed as (i, j, k) to represent three directions comprises using the dMRI data to obtain a first one of the three directions and basing a second one and a third one of the three directions on a local geometry of a heart wall.

20. The system of claim 19, wherein the region is a volumetric region or a distributed region, and wherein missing information is recovered for a plurality of regions in the heart wall in order to reconstruct a three-dimensional image of fiber orientations.

\* \* \* \* \*